(12) United States Patent
Catalasan et al.

(10) Patent No.: US 7,768,037 B2
(45) Date of Patent: Aug. 3, 2010

(54) PROGRAMMABLE MEMORY CELL IN AN INTEGRATED CIRCUIT CHIP

(75) Inventors: Manolito M. Catalasan, Mission Viejo, CA (US); Vafa J. Rakshani, Newport Coast, CA (US); Edmund H. Spittles, Chippenham (GB); Tim Sippel, Los Altos, CA (US); Richard Unda, Fullerton, CA (US)

(73) Assignee: Broadcom Corporation, Irvine, CA (US)

( * ) Notice: Subject to any disclaimer, the term of this patent is extended or adjusted under 35 U.S.C. 154(b) by 524 days.

(21) Appl. No.: 11/701,449

(22) Filed: Feb. 2, 2007

(65) Prior Publication Data

US 2007/0131966 A1 Jun. 14, 2007

Related U.S. Application Data

(63) Continuation of application No. 10/697,079, filed on Oct. 31, 2003, now abandoned.

(60) Provisional application No. 60/477,338, filed on Jun. 11, 2003, provisional application No. 60/488,800, filed on Jul. 22, 2003.

(51) Int. Cl.
*H01L 27/10* (2006.01)

(52) U.S. Cl. .............................. 257/211; 257/E33.062; 326/38

(58) Field of Classification Search .................. 257/181, 257/208–211, E33.062, E33.066; 326/38
See application file for complete search history.

(56) References Cited

U.S. PATENT DOCUMENTS 5,068,603 A 11/1991 Mahoney
5,408,428 A 4/1995 Burgess et al.
5,459,355 A 10/1995 Kreifels (Continued)

FOREIGN PATENT DOCUMENTS

EP 1 100 125 A1 5/2001

(Continued)

OTHER PUBLICATIONS

EP Search Report for EP Application No. 04013796.0-2203, mailed Nov. 16, 2004.

(Continued)

*Primary Examiner*—Davienne Monbleau
(74) *Attorney, Agent, or Firm*—Sterne, Kessler, Goldstein & Fox PLLC

(57) ABSTRACT

A memory cell for reducing the cost and complexity of modifying a revision identifier (ID) or default register values associated with an integrated circuit (IC) chip, and a method for manufacturing the same. The cell, which may be termed a "Meta-Memory Cell" (MMCEL), is implemented on metal layers only and utilizes a dual parallel metal ladder structure that traverses and covers each metal and via layer from the bottom to the top of the metal layer structure of the chip. One of the metal ladders is connected to a power supply at the bottom metal layer, corresponding to a logic 1, and another metal ladder is connected to ground at the bottom metal layer, corresponding to a logic 0. The output of the MMCEL can thus be inverted at any metal or via layer and can be inverted as often as required. Significant cost savings are achieved because a revision ID or default register bits may be modified by altering only those metal layers where design changes are necessary.

7 Claims, 27 Drawing Sheets

U.S. PATENT DOCUMENTS

| | | |
|---|---|---|
| 5,590,069 A | 12/1996 | Levin |
| 5,644,144 A | 7/1997 | Ray |
| 5,831,280 A | 11/1998 | Ray |
| 6,292,024 B1 | 9/2001 | Jensen et al. |
| 6,331,790 B1 | 12/2001 | Or-Bach et al. |
| 6,756,811 B2 * | 6/2004 | Or-Bach ............... 326/41 |
| 6,765,245 B2 | 7/2004 | Bansal |
| 6,933,547 B2 | 8/2005 | Catalasan et al. |
| 6,958,517 B2 * | 10/2005 | Denham ............... 257/368 |
| 7,078,936 B2 | 7/2006 | Catalasan et al. |
| 2003/0023945 A1 * | 1/2003 | Wang et al. ............... 716/16 |
| 2004/0251472 A1 | 12/2004 | Catalasan et al. |
| 2004/0253778 A1 | 12/2004 | Catalasan et al. |

FOREIGN PATENT DOCUMENTS

| | | | |
|---|---|---|---|
| EP | 1 494 283 | A1 | 1/2005 |
| GB | 2 338 593 | A | 12/1999 |
| WO | WO 02/18960 | A2 | 3/2002 |

OTHER PUBLICATIONS

EP Search Report for EP Application No. 04013796.0-2203, mailed Oct. 26, 2004.

Office Action, mailed Apr. 19, 2005, in U.S. Appl. No. 10/697,289, filed Oct. 31, 2003, 7 pages.

Office Action, mailed Sep. 2, 2005, in U.S. Appl. No. 10/697,289, filed Oct. 31, 2003, 9 pages.

Office Action, mailed Jun. 26, 2007, in U.S. Appl. No. 10/697,889, filed Oct. 31, 2003, 6 pages.

European Search Report, mailed Sep. 14, 2005, from European Patent Application No. 04016857.7, 3 pages.

Office Action, mailed Aug. 10, 2006, in U.S. Appl. No. 10/697,079, filed Oct. 31, 2003, 6 pages.

Office Action, mailed Feb. 21, 2006, in U.S. Appl. No. 10/697,079, filed Oct. 31, 2003, 8 pages.

* cited by examiner

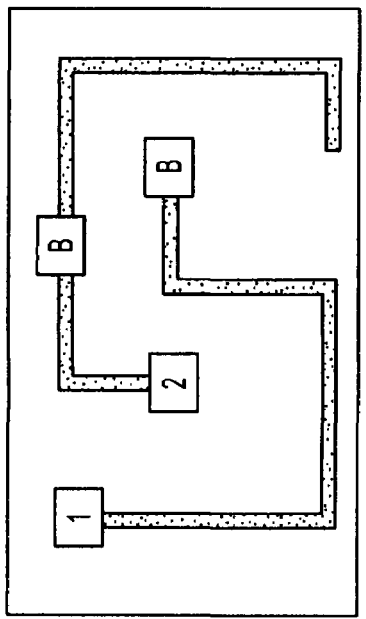
FIG. 12C
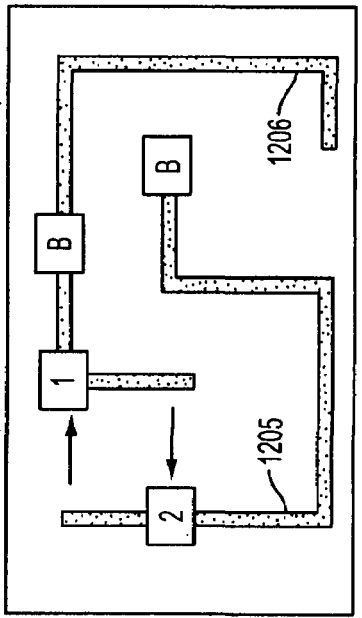
FIG. 12D
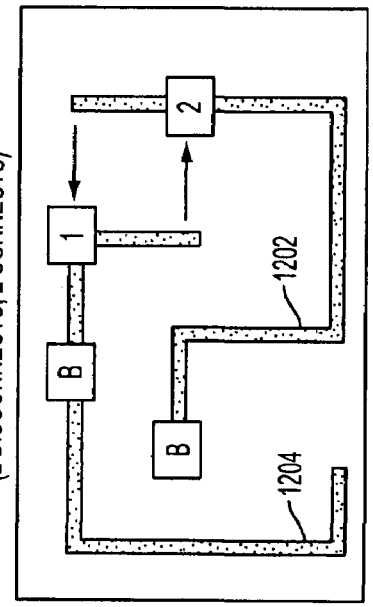
FIG. 12B
FIG. 12A

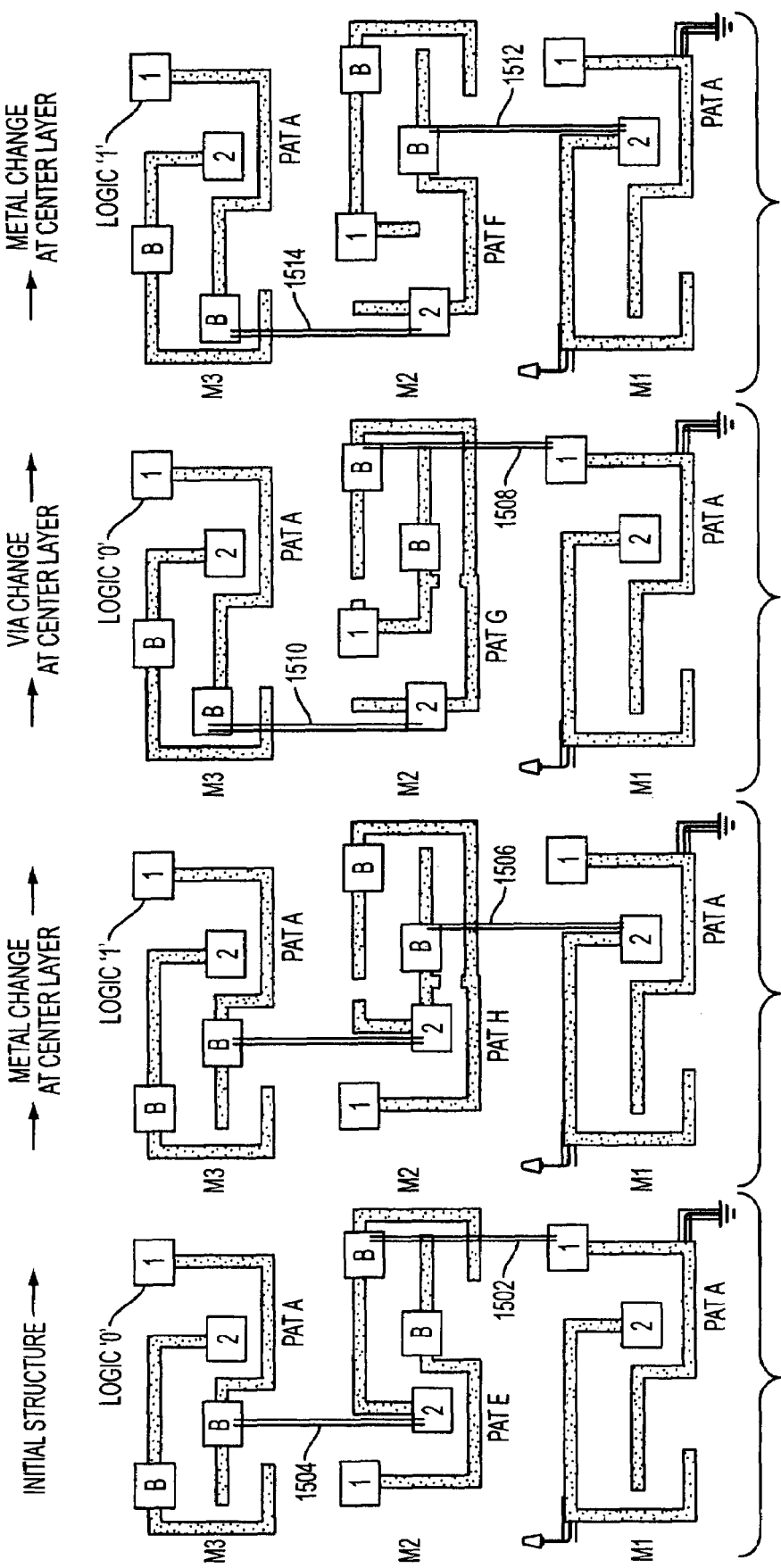

PROGRAMMABLE MEMORY CELL IN AN INTEGRATED CIRCUIT CHIP

CROSS-REFERENCE TO RELATED APPLICATIONS

This application is a continuation of U.S. patent application Ser. No. 10/697,079, filed on Oct. 31, 2003 which claims priority to U.S. Prov. App. Nos. 60/477,338 filed Jun. 11, 2003, and 60/488,800 filed Jul. 22, 2003, each entitled "MEMORY CELL FOR MODIFICATION OF REVISION IDENTIFIER AND/OR DEFAULT REGISTER VALUES IN AN INTEGRATED CIRCUIT CHIP AND METHOD FOR MANUFACTURING SAME," and which are incorporated by reference herein in their entirety.

This application is related to U.S. application Ser. No. 10/697,889, entitled "METHOD FOR MANUFACTURING A MEMORY CELL FOR MODIFICATION OF REVISION IDENTIFIER IN AN INTEGRATED CIRCUIT CHIP"; U.S. application Ser. No. 10/697,286, entitled "MEMORY CELL FOR MODIFICATION OF DEFAULT REGISTER VALUES IN AN INTEGRATED CIRCUIT CHIP"; and U.S. application Ser. No. 10/697,282, entitled "COUPLING OF SIGNALS BETWEEN ADJACENT FUNCTIONAL BLOCKS IN AN INTEGRATED CIRCUIT CHIP", all filed concurrently herewith, which are all incorporated by reference herein in their entirety.

BACKGROUND OF THE INVENTION

1. Field of the Invention

The present invention is directed to integrated circuit (IC) chips, and more particularly to revision identification (ID) number modification.

2. Related Art

Embodiments of the present invention provide solutions to a problem that plagues conventional integrated circuit (IC) chips. The problem is the hidden cost of additional metal mask layers when implementing a revision identification (ID) of the chip. This is a necessary requirement in order to inform a customer through software that the existing design of the chip has changed.

Conventionally, the revision ID is implemented as bits that are tied to either VDD (supply) or GND (ground) at any arbitrary layer of the chip. An additional metal layer is consumed by the revision ID when actual design changes are made on a different metal layer than where the revision ID was originally connected. For example, an additional metal layer will be consumed if the chip requires a logic fix on the metal layer two and the next revision ID bit needs to be tied to GND (ground) on the metal layer four. This will require two metal mask layer changes instead of just one on the metal layer two. Modification to the metal layer four is not necessary if the Revision ID could be changed in the metal layer two. In 0.18 µm technology, the cost per metal layer is high, and in 0.13 µm technology, the cost is even higher.

Hence, the cost increases for finer pitch technology.

Additional costs also result from the engineering hours spent on the laborious layout task of minimizing the number of metal layers used to implement a change in the revision ID. For example, this task may consume a number of days just to save a metal mask. In addition, completely unique designs must be implemented for each chip in order to save mask costs. As a result, these designs cannot be re-used for other projects.

Significant cost savings for a company can be attained if one could completely eliminate the waste of mask layers and extra labor due to revision ID bit changes. This is a problem that affects a vast number of conventional IC chips.

Modifiable revision ID schemes exist, such as those described in U.S. Pat. Nos. 5,590,069 and 5,644,144, which are incorporated by reference herein in their entirety. The schemes disclosed in these two patents suffer from inefficient topological layouts.

Thus, what is needed is an integrated circuit memory cell structure that permits revision ID bit modifications to be contained only on mask layers where required logic changes are made, thereby reducing the cost of each chip design iteration, at minimal chip real-estate expense.

BRIEF SUMMARY OF THE INVENTION

The present invention is directed to a meta-memory cell for implementing revision bits in an integrated circuit chip. The integrated circuit chip includes a plurality of metal layers. The meta-memory cell comprises first and second metal interconnect structures. A first metal interconnect structure traverses the plurality of metal layers using a first plurality of vias. A second metal interconnect structure traverses the plurality of metal layers using a second plurality of vias.

In one embodiment, prior to programming the meta-memory cell, the first and second metal interconnect structures are coupled at a top metal layer and an output is coupled to power or ground by at least one of the first and second metal interconnect structures, wherein a state of the output is programmable by altering at least one of the plurality of metal layers.

Multiples of the first and second metal interconnect structures can be coupled together to form a plurality of programmable cycles for the memory cell, wherein each half cycle is programmable at least once.

Each cycle can be laid-out to form a ladder structure that traverses the plurality of metal layers from a bottom metal layer to a top metal layer and back to the bottom metal layer. The ladder structure can be arranged to form a cube-shaped structure. Alternatively, the ladder structure can be arranged in the shape of a spiral.

Each of the first and second metal interconnect structures can be reprogrammed repeatedly by altering any one of the plurality of metal layers.

Alternatively, each of the first and second metal interconnect structures can be reprogrammed repeatedly by altering any one of a plurality of via layers.

In another embodiment, the memory cell comprises a first metal interconnect structure that traverses the plurality of metal layers using a first plurality of vias, a second metal interconnect structure that traverses the plurality of metal layers using a second plurality of vias, and an output coupled to power and ground by at least one of the first and second metal interconnect structures. Each of the first and second metal interconnect structures can be programmed repeatedly by altering any one of the plurality of metal layers and any one of a plurality of via layers.

In this embodiment, the first and second metal interconnect structures are not electrically coupled to each other at a top metal layer, so as to thereby form two outputs for the memory cell. One of the first and second metal interconnect structures can be coupled to power at a bottom metal layer and the other of the first and second metal interconnect structures can be coupled ground potential at the bottom metal layer.

The first and second metal interconnect structures can be arranged to form a ladder structure or an offset ladder structure. Moreover, the first and second metal interconnect structures can be arranged to form a stacked structure. The stacked structure can comprise first and second alternating metal interconnect patterns. The first alternating metal interconnect pattern can comprise first and second interspersed metal traces, and the second alternating metal interconnect pattern can comprise third and fourth interspersed metal traces, wherein the third and fourth interspersed metal traces form a mirror image of first and second interspersed metal traces. The first plurality of vias interconnect ones of the first and third interspersed metal traces and the second plurality of vias interconnect ones of the second and fourth interspersed metal traces.

The memory cell can be programmed at any metal layer by forming an open circuit in each of the first and second interspersed metal traces of that layer thereby splitting each metal trace into two portions, and coupling together a first portion of the first interspersed metal trace to a first portion of the second interspersed metal trace and coupling together a second portion of the first interspersed metal trace to a second portion of the second interspersed metal trace. The programming is reversible during any subsequent chip revision.

The memory cell can be programmed at any of a plurality of via layers by removing two vias and inserting two vias. This programming is also reversible during any subsequent chip revision.

One of the first and second metal interconnect structures can be coupled to power at a bottom metal layer and the other of the first and second metal interconnect structures can be coupled to ground at the bottom metal layer.

The memory cells of the present invention can be inserted into subsequent versions of previously designed chips. For example, chips that have been fabricated and whose base layers are already fixed can receive the memory cells of the present invention during an all-metal change provided that sufficient chip space is available. This drop-in compatibility permits chip designers to enable or disable logic fixes in one metal or one via layer through use of memory cells of the present invention, which can reduce design risks due to cost.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 11A-D illustrate MMCEL layout edit rules for metal changes according to the present invention.

FIGS. 12A-12D describe MMCEL via edit rules according to the present invention.

Figure 13:
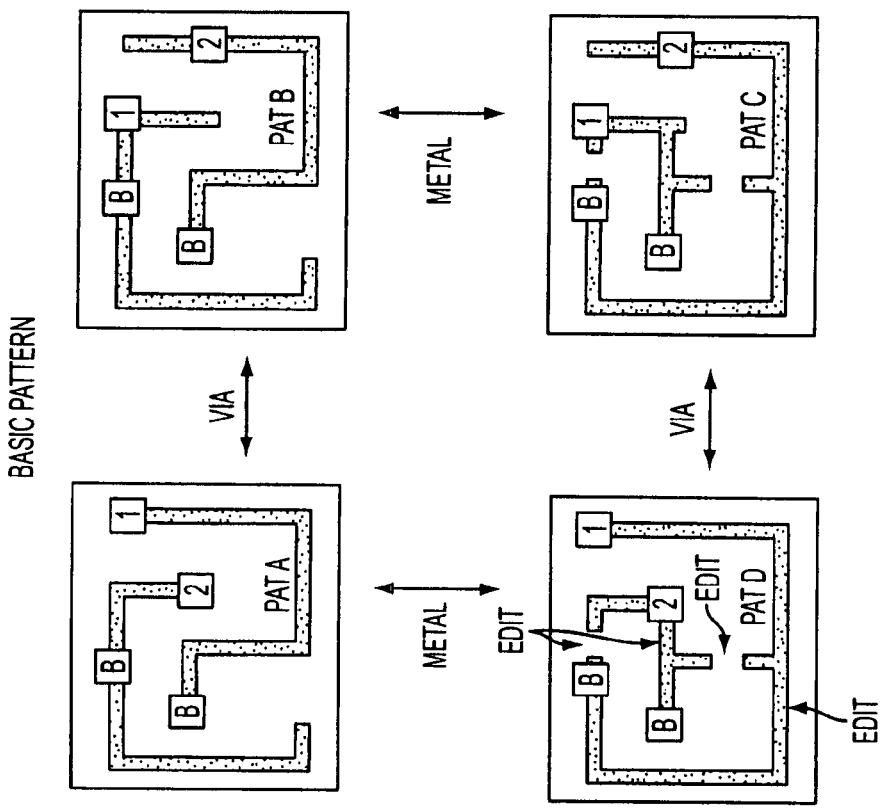

FIG. 13 illustrates MMCEL basic pattern layout permutations according to the present invention.

Figure 14:
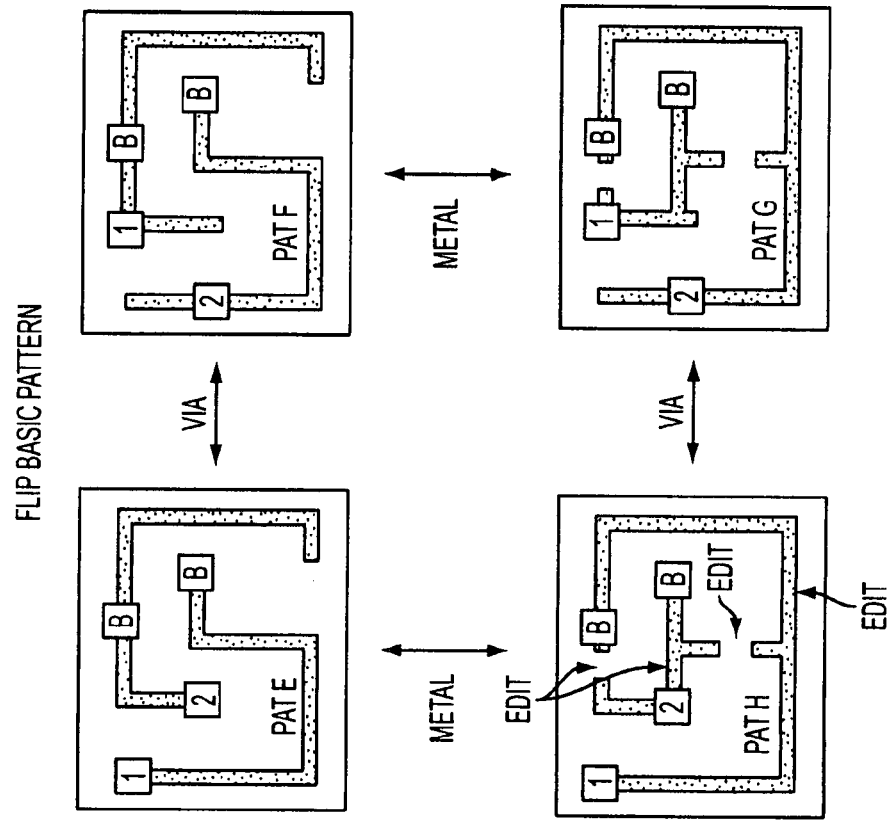

FIG. 14 illustrates an MMCEL flip basic pattern layout permutation according to the present invention.

FIGS. 15A-15D illustrate a triple metal MMCEL stack layout example according to the present invention.

FIGS. 16, 17A-C, 18A-C, 19A-C, 20A-C and 21A-C illustrate an MMCEL layout in a six metal layer implementation according to the present invention.

Figure 22:
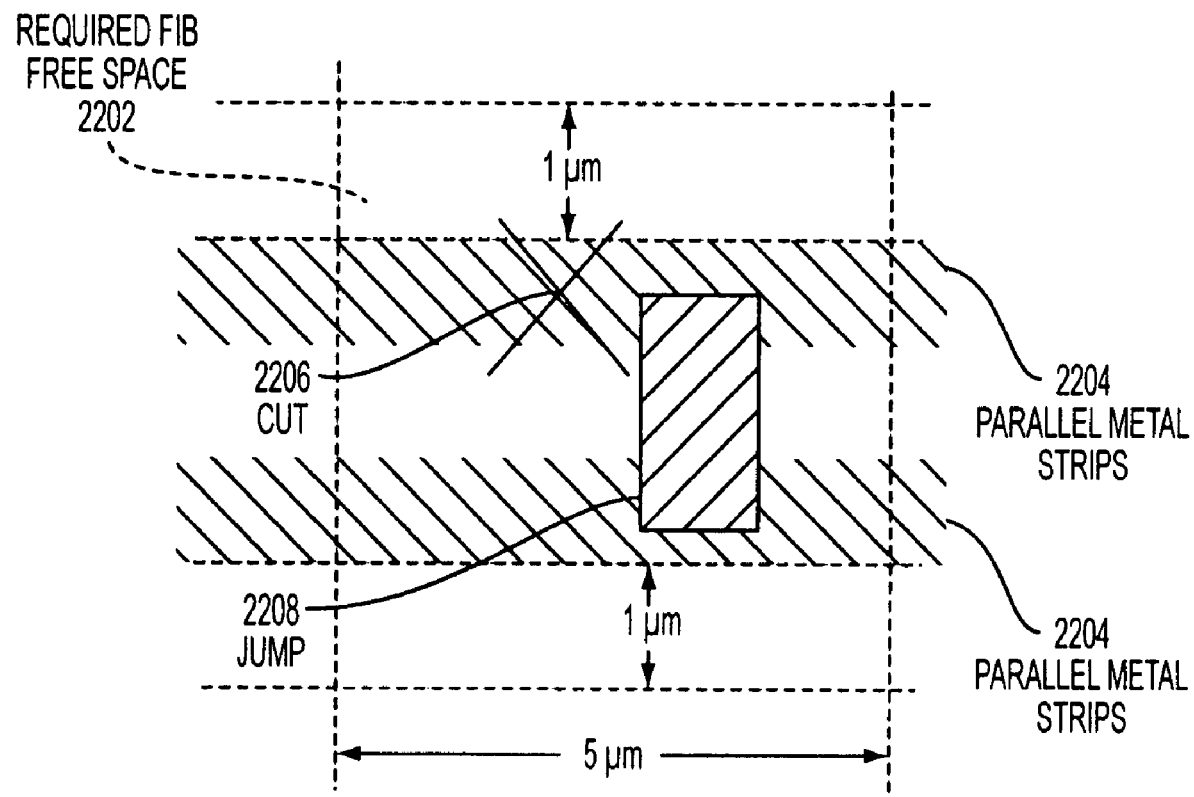

FIG. 22 illustrates the use of FIB technology for programming the MMCEL of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

The preferred embodiment of the present invention will now be discussed in detail. While specific features, configurations and arrangements are discussed, it should be understood that this is done for illustration purposes only. A person skilled in the relevant art will recognize that other steps, configurations and arrangements or devices may be used to achieve the features of the invention without departing from the spirit and scope thereof. Indeed, for the sake of brevity, conventional electronics, manufacturing of semiconductor devices, and other functional aspects of the method/apparatus (and components of the individual operating components of the apparatus) may not be described in detail herein.

The terms chip, integrated circuit, monolithic device, semiconductor device, and microelectronic device are often used interchangeably in this field. The present invention is applicable to all the above as they are generally understood in the field.

The material commonly used to form conductors in semiconductor integrated circuit chips is metal, such as copper, aluminum, various alloys, polycrystalline silicon (polysilicon), and the like. The term "metal" will be used herein to cover any type of conductor, including but not limited to the foregoing metals and polysilicon. The terms conductive line or path, strips and traces are used interchangeably herein to refer to a metal conductor. Metal layers will be referred to by number, such as M3 for metal layer three, and so on.

The term "via" as used herein refers to an area or opening in a dielectric layer that provides an electrical pathway from one metal layer to the metal layer above or below. The electrical pathway comprises a metal that fills the via. Alternatively, the via walls are made conductive.

Further, background material concerning semiconductor solid-state physics and manufacturing can be found in a number of publicly available references including two books by S. M. Sze, titled: Physics of Semiconductor Devices, John Wiley and Sons, Inc., New York (1981), and Semiconductor Devices, Physics and Technology, John Wiley and Sons, Inc., New York (1985), both of which are incorporated herein by reference.

It should be understood that the spatial descriptions (e.g., "above", "below", "up", "down", etc.) made herein are for purposes of illustration only.

The invention is directed to a circuit, called a Meta-Memory Cell (MMCEL), to facilitate the modifications of the revision ID bits at any metal or via layer. The required number of metal layers for the next design iteration is greatly reduced by the MMCEL because the revision ID bit changes can be made on the same metal layer as the logic design fix.

The MMCEL resembles a hard-wired memory cell with dual complementary outputs. The MMCEL utilizes all layers of metal including metal vias to fully meet its design requirement. Unlike a silicon-based non-volatile programmable memory, the MMCEL does not require active silicon (i.e., the base layers) to retain a programmed logic value. Instead, it relies only on the alteration of any single metal or via layer for re-programming. When inserted into existing chip designs, only one metal or via layer change is required to utilize the MMCEL.

The following figures and accompanying description more fully describe the present invention.

Figure 1:
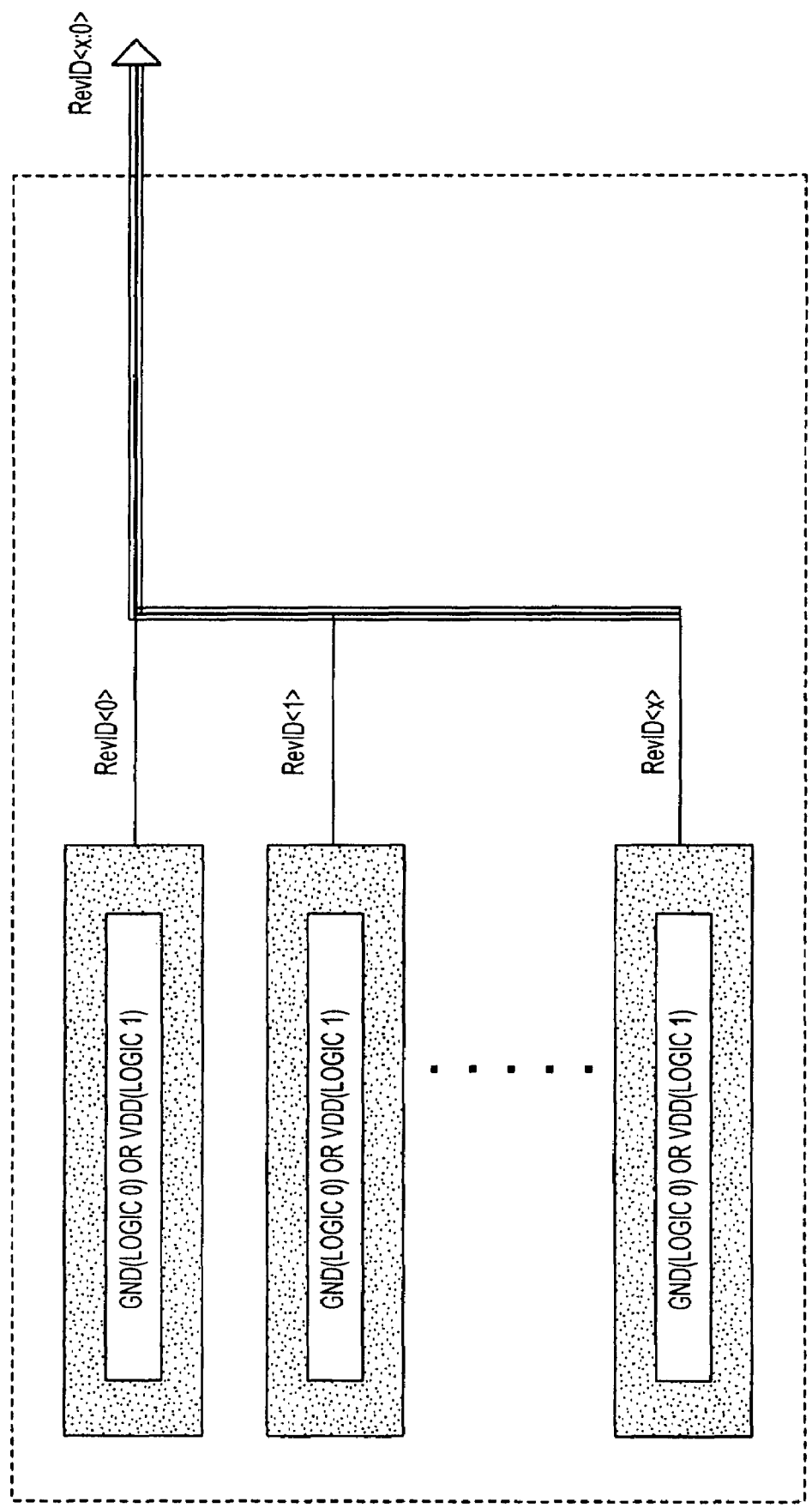
FIG. 1 illustrates a schematic block diagram of revision identification (ID) bits.

FIG. 1 illustrates a schematic block diagram of revision identification (ID) bits. A plurality of revision ID bits RevID <0> through RevID <x> are combined to form a revision identification word RevID<x:0>. The revision identification word typically comprises 8 bits, but may comprise 16 bits, 32 bits, or the like, as would be apparent to a person having ordinary skill in the art.

Figure 2:
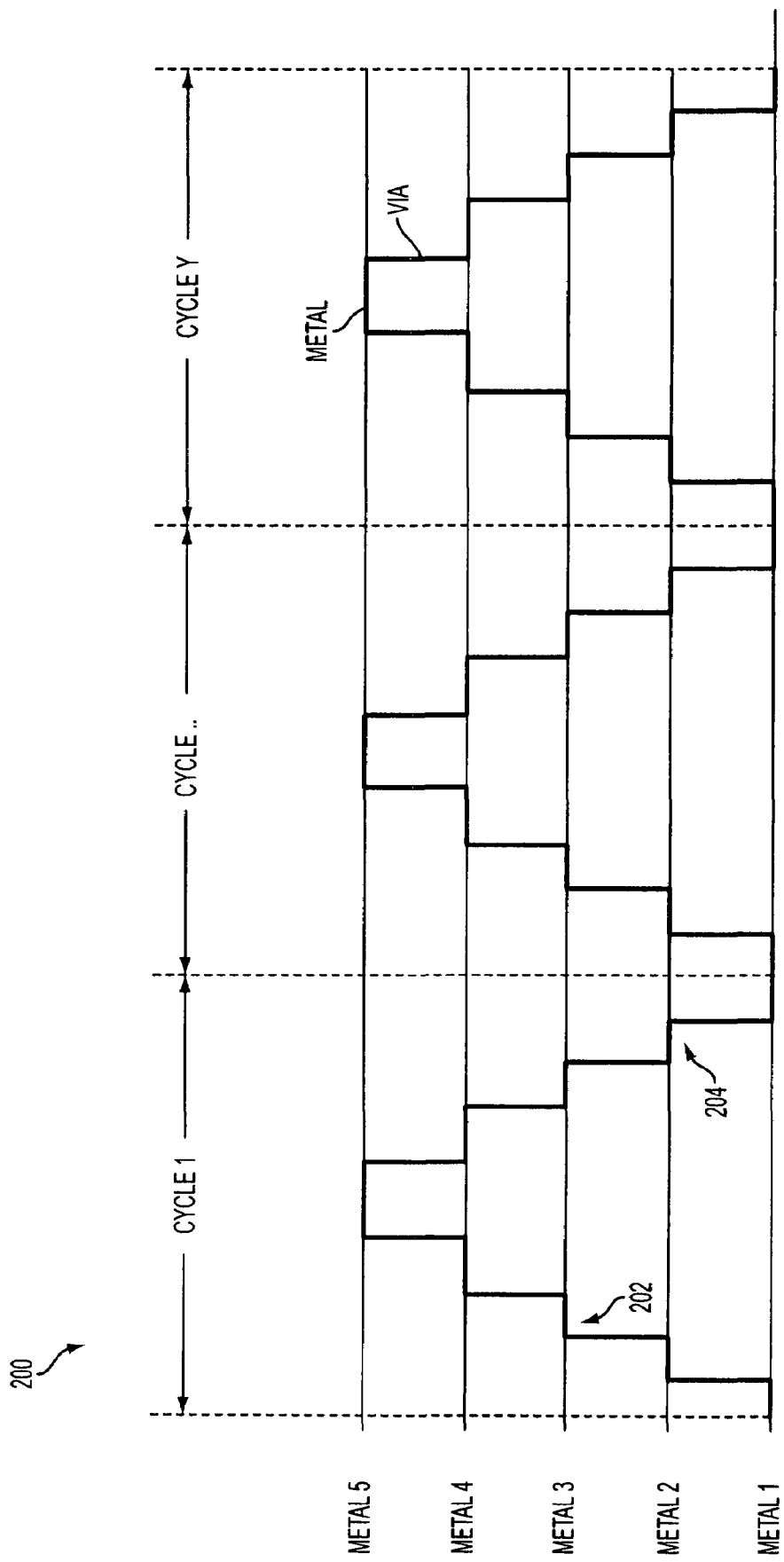
FIG. 2 illustrates a meta-memory cell (MMCEL) according to an embodiment of the present invention.

FIG. 2 illustrates a single meta-memory cell (MMCEL) according to an embodiment of the present invention. According to this embodiment, MMCEL 200 comprises cycles 1 through Y. Each MMCEL cycle comprises two ladders (e.g., 202 and 204) that traverse layers of an integrated circuit (five metal layers are depicted, for example). Each horizontal rung of the serpentine ladder structure is formed of metal traces at any one of metal layers 1-5 (M1-M5). Each vertical rung of the ladder structures comprises a via formed in a material layer between any two adjacent metal layers, as would also be apparent to a person having ordinary skill in the art.

A plurality of MMCELs (each comprising a given number of cycles) form a single revision identification word. For example, an 8 bit revision identification word would comprise eight MMCELs.

The number of whole cycles that an MMCEL has depends on the number of revisions a integrated circuit designer contemplates for a given integrated circuit during the production life of that integrated circuit.

Figure 3A:
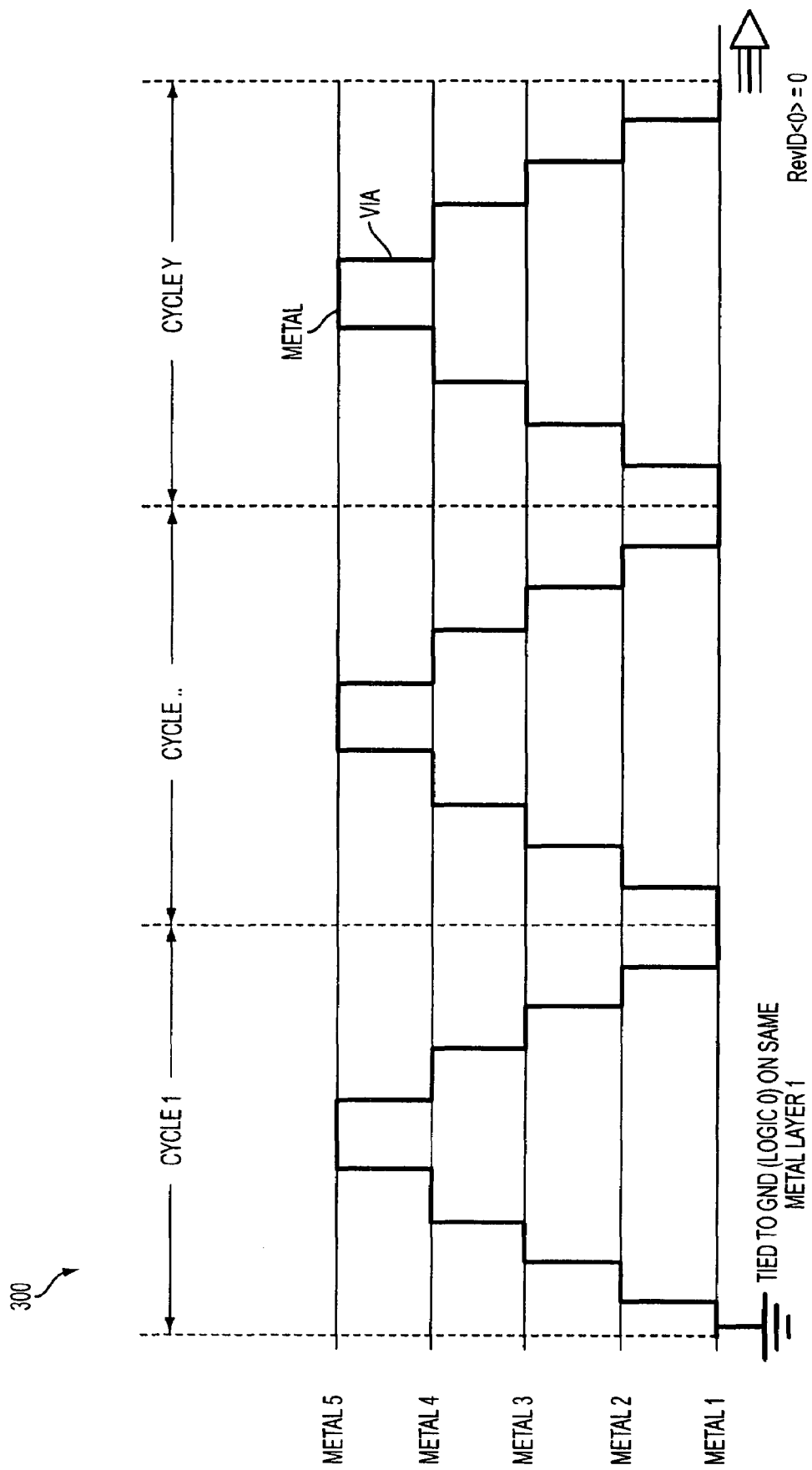
FIGS. 3A-3C illustrate an MMCEL according to the present invention.

FIG. 3A illustrates an MMCEL having the beginning of cycle one tied to ground (logic 0) at M1. The output of this MMCEL 300 is provided at the end of cycle Y, also at M1, and provides revision ID output RevID <0>. Thus, the output of MMCEL 300 is a logic 0.

Figure 3B:
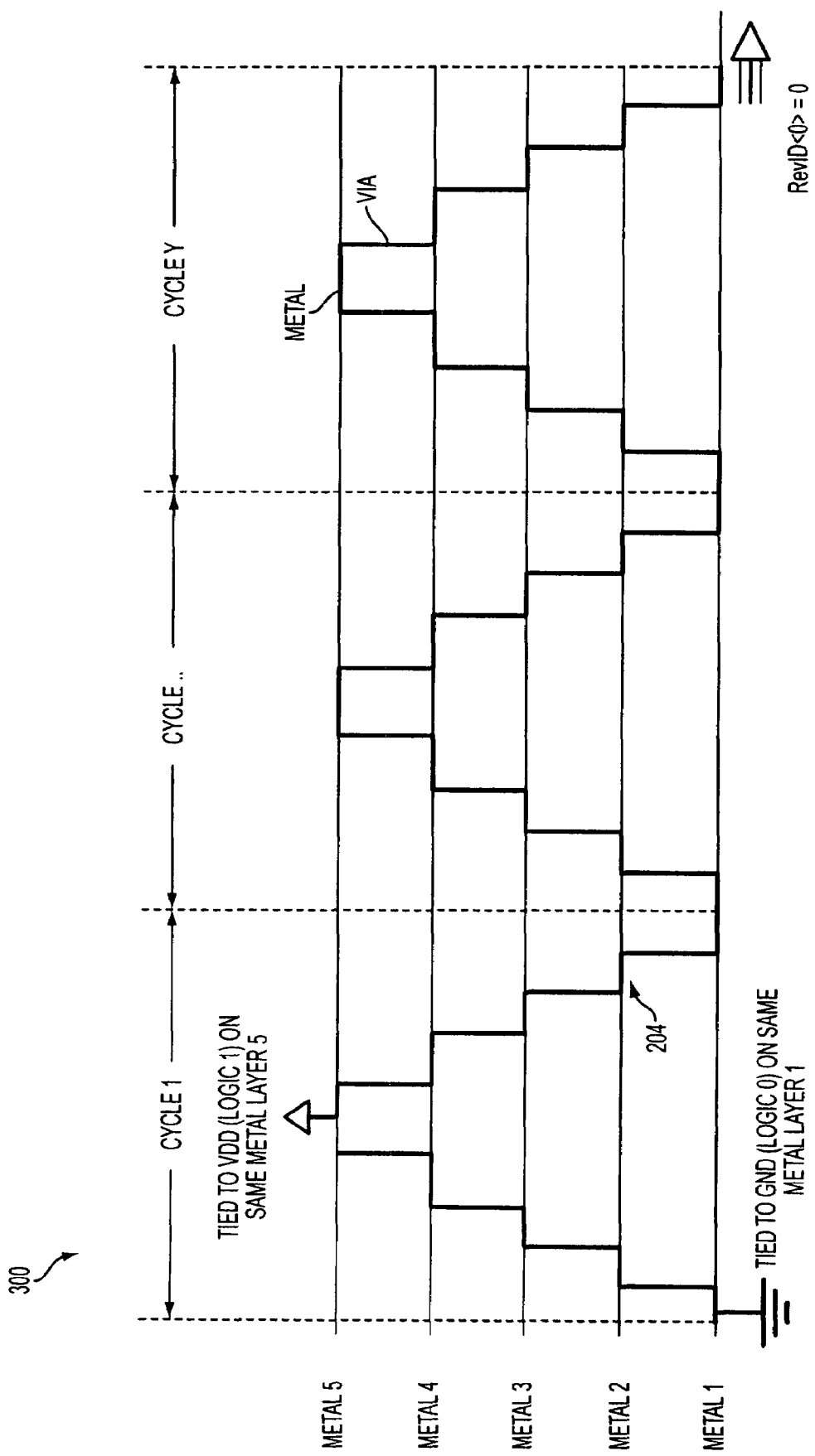

FIG. 3B illustrates a modification to MMCEL 300. In order to change the value of MMCEL 300 output RevID <0> during a later revision of the integrated circuit, the interconnected metal ladders of cycles one through cycle Y must be changed.

In this example, the first revision to the integrated circuit is performed in cycle one of MMCEL 300. Assuming that a revision to the integrated circuit is made to the mask corresponding to M5, this layer will be used to modify the revision bit. This avoids having to make modifications to any other mask in the manufacturing process. In this case, the metal trace at cycle one on M5 is tied to a power supply (e.g., VDD or logic 1). Tying the ladder 204 of cycle one to VDD inverts the output of MMCEL 300 from logic 0 to logic 1.

Providing each cycle of the MMCEL with two ladders permits at a minimum of two revisions per cycle of the MMCEL. For example, an MMCEL comprising three full cycles can be modified a minimum of 6 times in order to implement numerous modifications to the revision bit. More revisions per cycle are possible, depending on which metal layers are modified and in what order per chip revision.

Figure 3C:
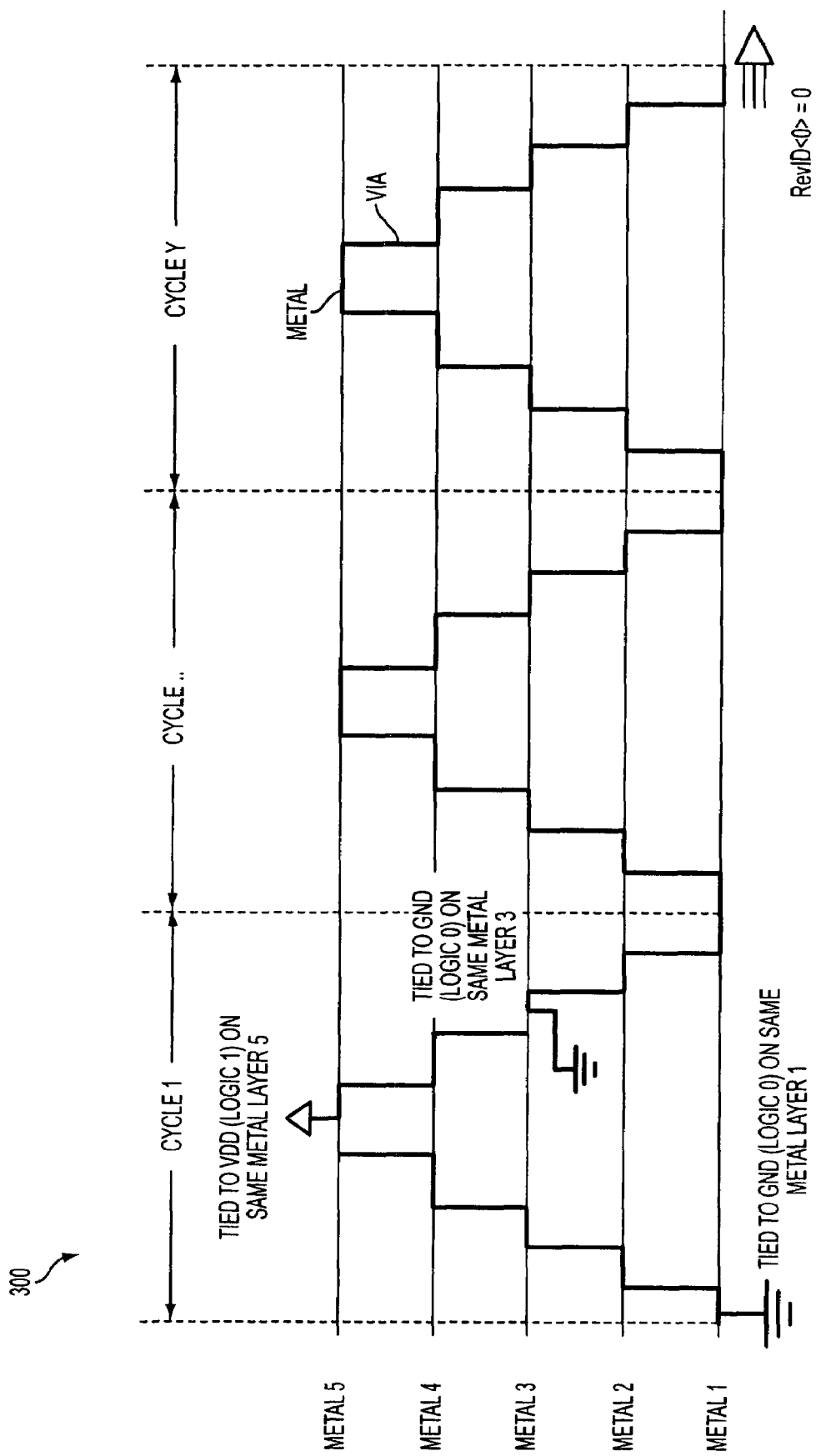

FIG. 3C illustrates another revision to cycle one in which ladder 204 is tied to ground (logic 0) on M3. This change causes the RevID <0> value to invert from logic 1 (as shown in FIG. 3B) back to logic 0.

Figure 4:
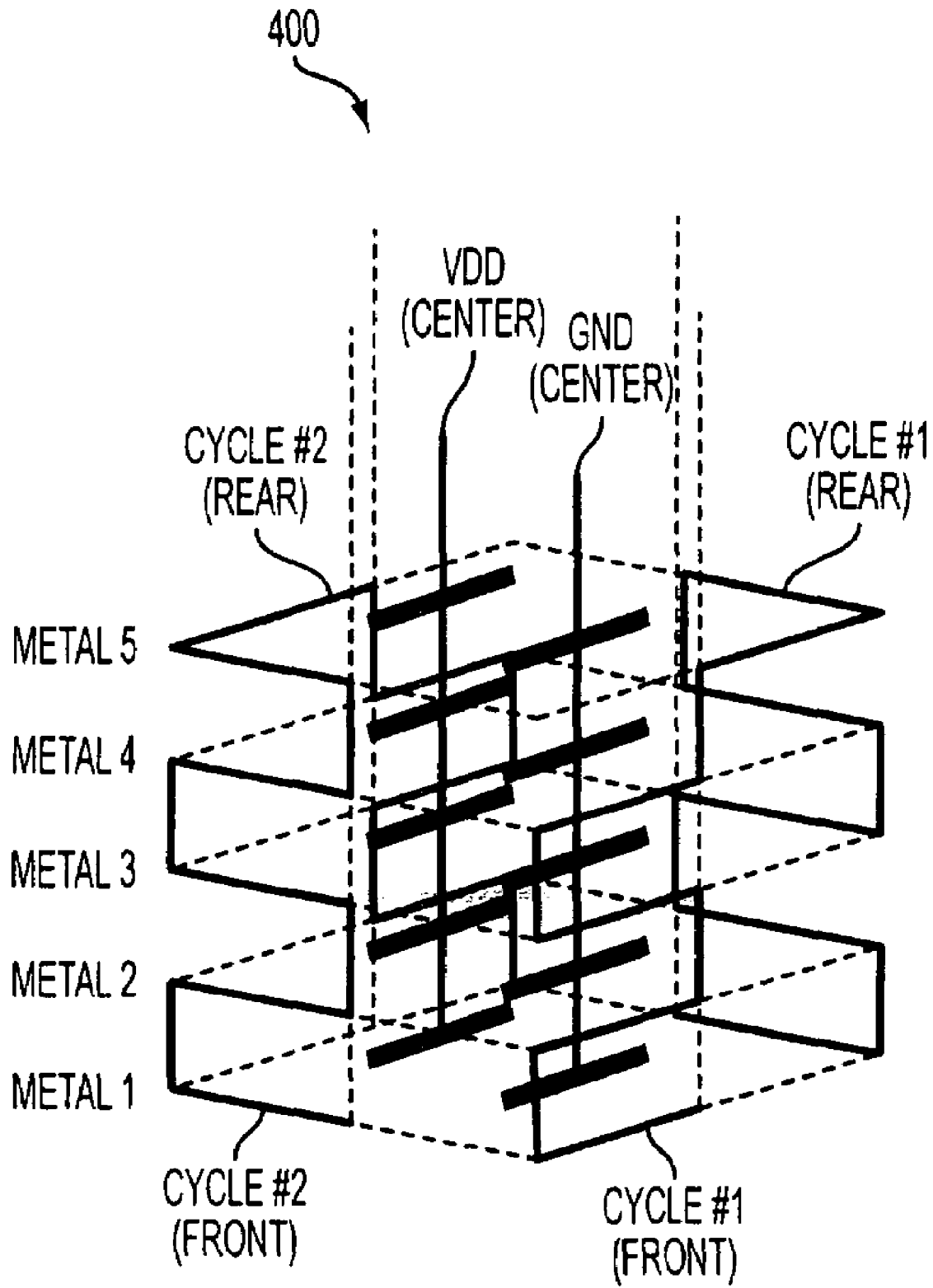
FIG. 4 illustrates another MMCEL embodiment according to the present invention.

Another MMCEL embodiment is illustrated in FIG. 4. Rather than the serpentine ladder illustrated in FIGS. 2 and 3A-C, the MMCEL of FIG. 4 is laid out in the shape of a 3-dimensional (3-D) cube. MMCEL 400 comprises two cycles. Power (VDD) and ground (GND) buses are formed in the center of the 3-D cube layout. This permits access to power and ground by any of the four half cycles at any of the metal layers M1-M5. Alternatively, power and ground buses can be placed external to the main structure. The internal metal widths of the traces should be wide enough to accommodate a low resistant path between this MMCEL and any adjacent circuit. Due to long trace routs when using this MMCEL structure, designers should be aware of the resistance-capacitance (RC) delay and its consequences within the integrated circuit. Buffers can be added within the structure as necessary to improve signal transmission along long routing paths, as would be apparent to a person having ordinary skill in the art.

Figure 5A:
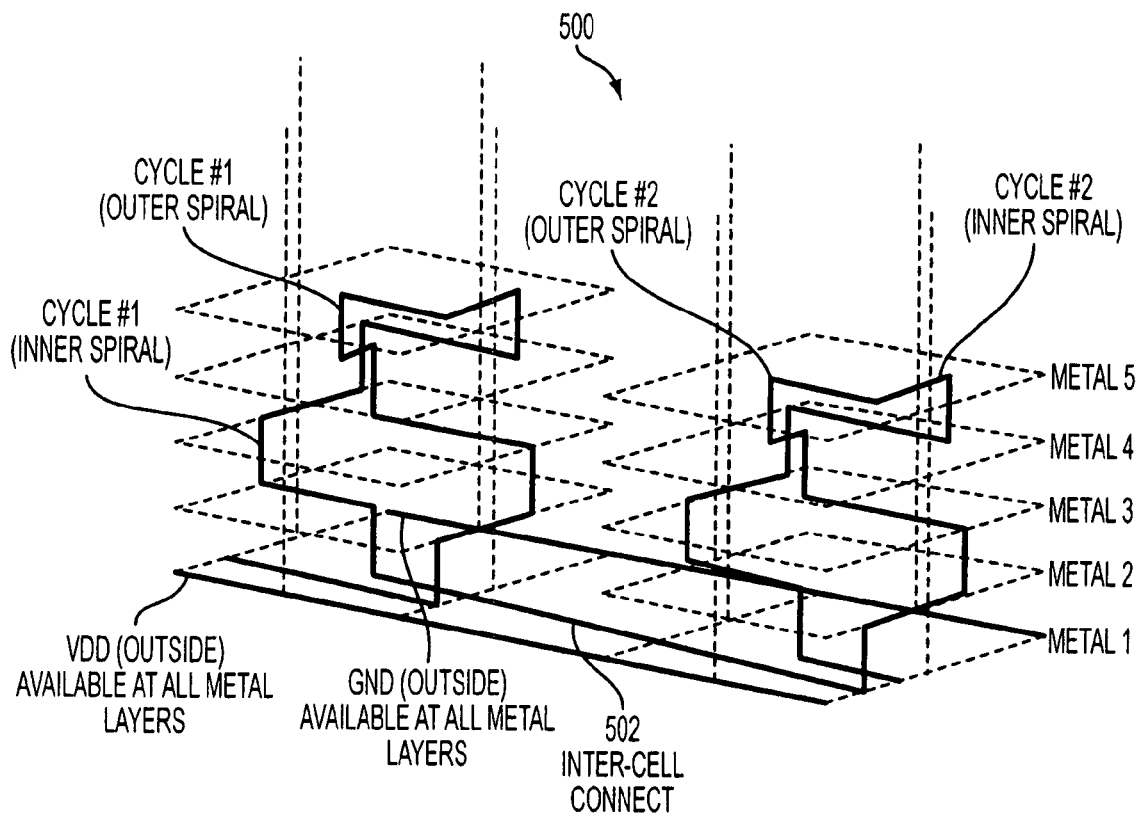
FIGS. 5A and 5B illustrate a 3-D spiral layout for an MMCEL 500 according to the present invention.
Figure 5B:
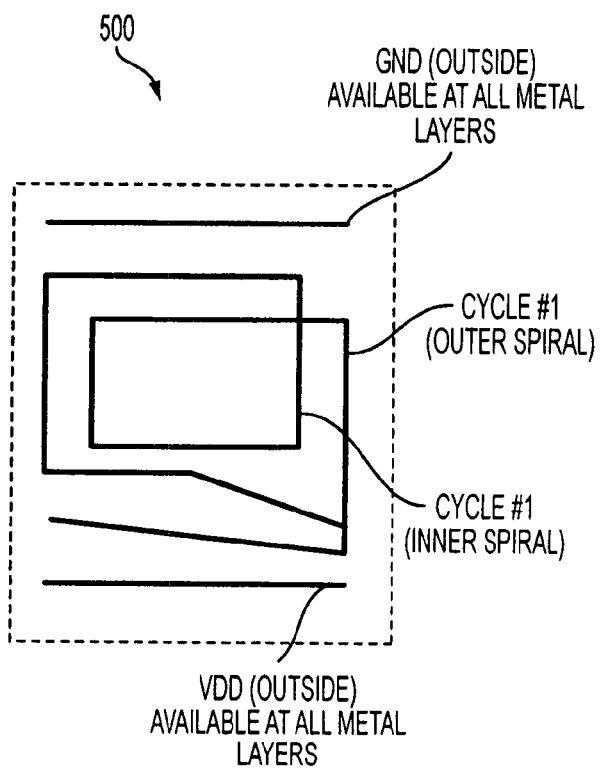

FIGS. 5A and 5B illustrate a 3-D spiral layout for an MMCEL 500. The spiral approach allows stacking of cycles to create greater than two cycles per cell as compared to MMCEL 400 of FIG. 4, for example. The power and ground buses are made available along the outside of the cell. Only two power and ground buses are illustrated at metal layer one in FIGS. 5A and 5B to simplify the drawing. However, power and ground buses should be provided at all metal layers for optimum programmability of the revision bit.

An inter-cell connect trace is illustrated at 502, which couples cycle number one and cycle number two.

The present invention simplifies the layout by eliminating the tedious work of routing the revision identification on the same layer as the design modifications to the integrated circuit. The layout changes are made locally at a predefined location according to the present invention. Moreover, no ERC or DRC violations occur according to the present invention because layout changes do not leave a floating metal trace; disconnected metal traces are tied to either ground or power.

Figure 6:
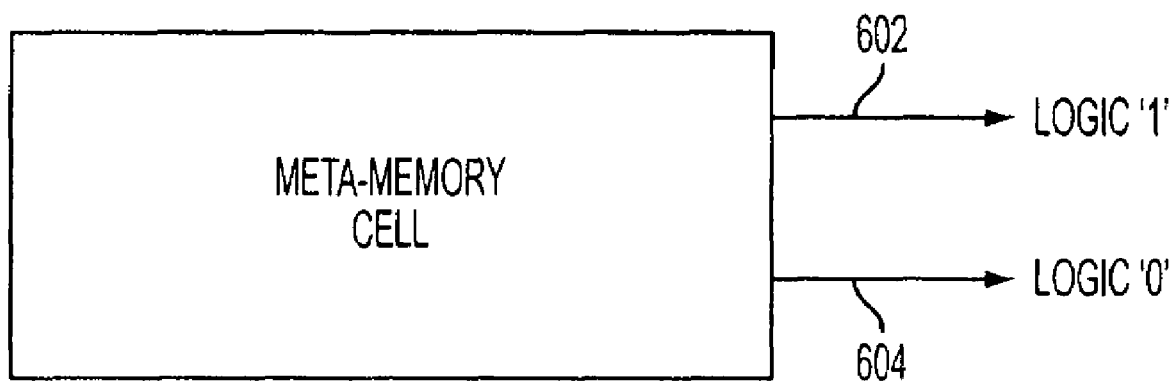
FIG. 6 illustrates a dual output MMCEL, according to the present invention.

A dual output MMCEL is illustrated in FIG. 6, according to another embodiment of the present invention. The dual output cell outputs a logic 1 and a logic 0 at outputs 602, 604, respectively. This MMCEL resembles a hard-wired memory cell with dual complementary outputs that is implemented on metal layers only. The MMCEL utilizes all layers of metal including metal vias to fully meet its design requirement.

Figure 7A:
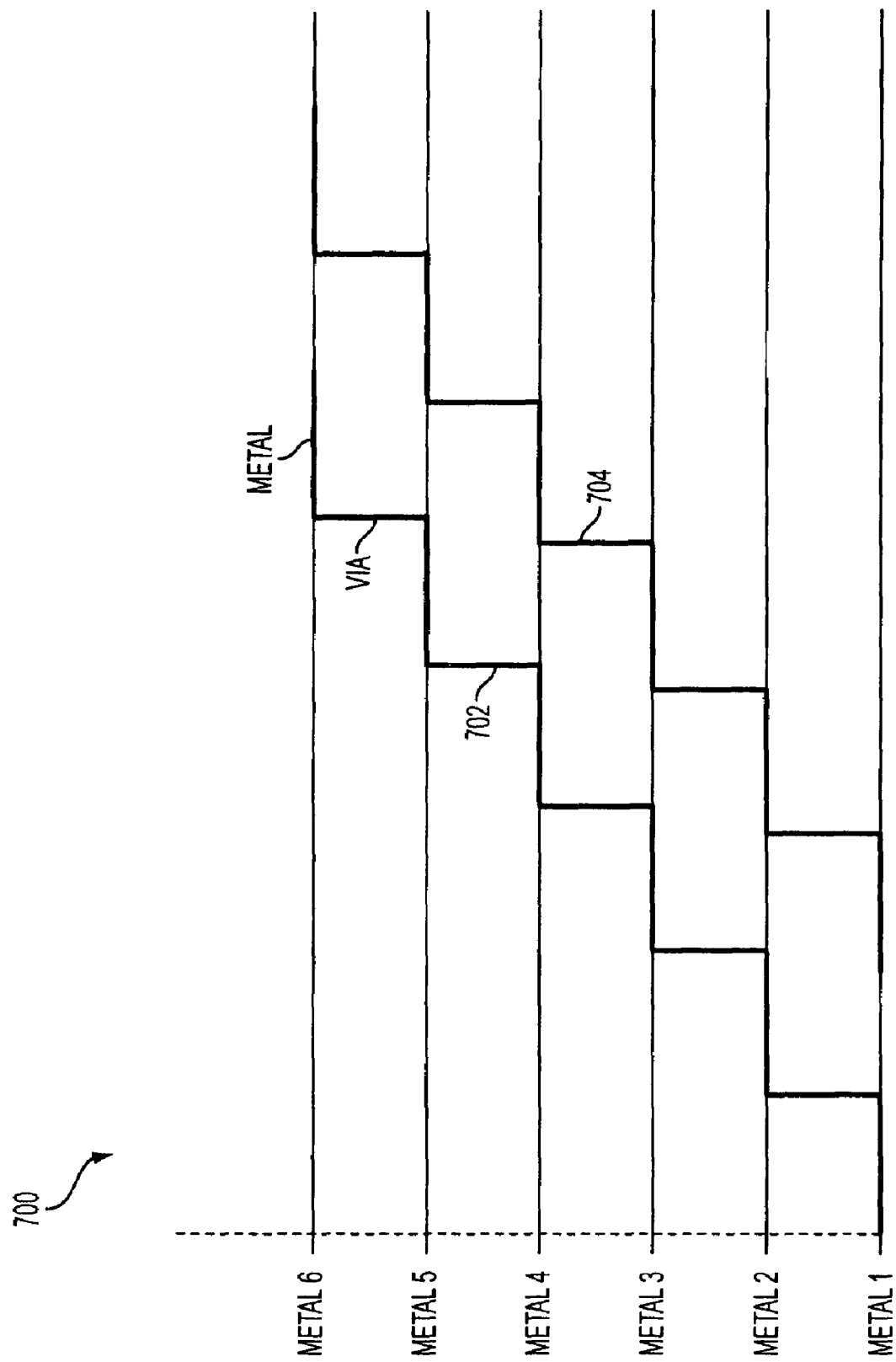
FIG. 7A illustrates a basic layout structure for an enhanced dual output MMCEL according to the present invention.

A basic layout structure for an enhanced dual output MMCEL is illustrated in FIG. 7A. Dual output MMCEL 700 comprises 2 metal ladders 702 and 704, which traverse all metal layers of the integrated circuit, such as metal layers M1-M6, for example.

The dual parallel metal ladder structure can traverse each metal and via layer of the chip. This allows the output of the MMCEL to be inverted at any metal or via layer. In addition, the dual parallel metal ladder structure enables the MMCEL unlimited design iterations. Thus, the output of the MMCEL can be inverted as often as required.

In accordance with the dual parallel metal ladder structure of the MMCEL, one metal ladder is connected to power (VDD) at the bottom layer M1 and another metal ladder is connected to ground (GND) also at M1. Both metal ladders reach the top metal layers (for example, M5 layer for 0.18 μm technology, M6 layer for 0.13 μm technology) depending on the requirements of the user. The outputs of the MMCEL come from a top layer connection to the metal ladders, as described below.

Figure 7B:
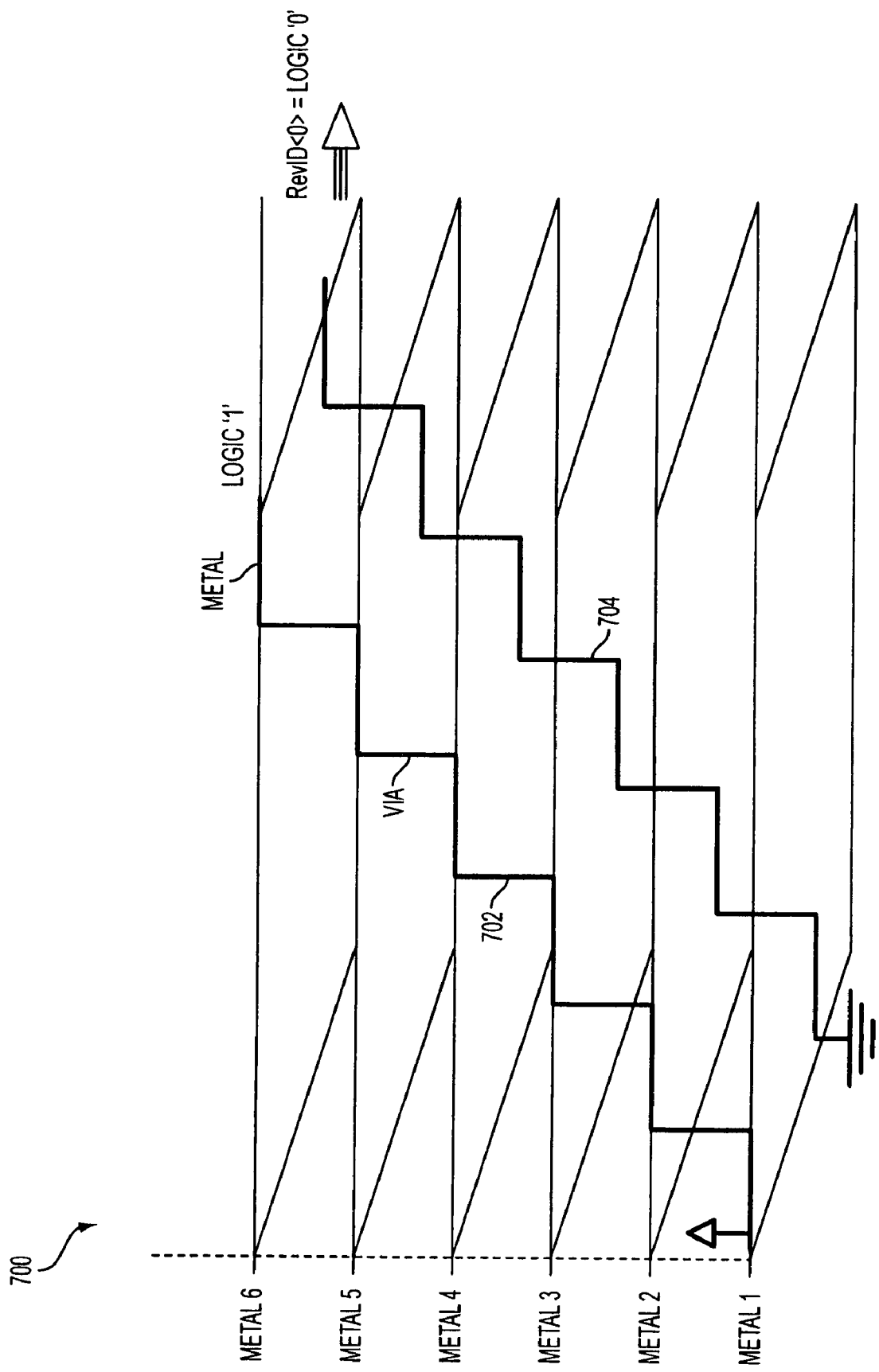
FIG. 7B illustrates MMCEL 700 with initial programming according to the present invention.

FIG. 7B illustrates MMCEL 700 with initial programming such that ladder 702 is coupled to power (VDD) at M1 and ladder 702 is coupled to ground (GND) at M1. Coupling ladder 702 to power and ladder 704 to ground produces a logic 1 and a logic 0 output, respectively. The MMCEL output RevID<0> can be selected at either output.

According to the present invention, the dual output MMCEL accommodates both single layer metal or single layer via changes in order to modify the output of the MMCEL. An infinite number of changes on any single layer of metal or single layer via can be performed at each cell.

Figure 7C:
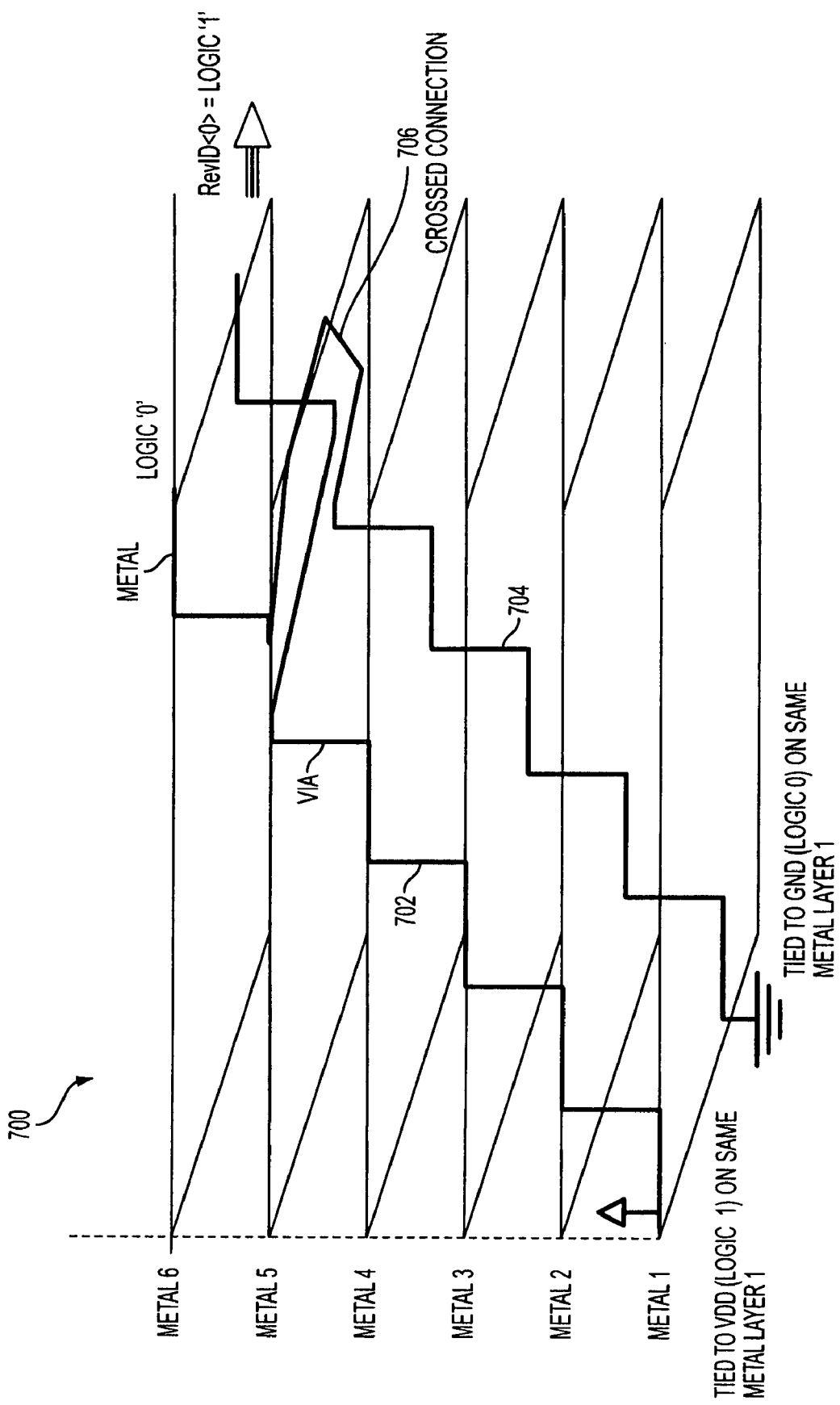
FIG. 7C illustrates a RevID<0> layout change according to the present invention.

FIG. 7C illustrates a RevID<0> layout change from logic 0 to logic 1 on M5 only. As shown at region 706, the metal traces of ladders 702 and 704 are cross-connected in order to invert both outputs of the dual MMCEL 700. This cross connection is achieved by altering the metal layer by forming two cuts and two jumps. Alternatively, the cross connection can be achieved by simultaneously moving two vias to form an alternative interconnection, as will be described below.

Figure 7D:
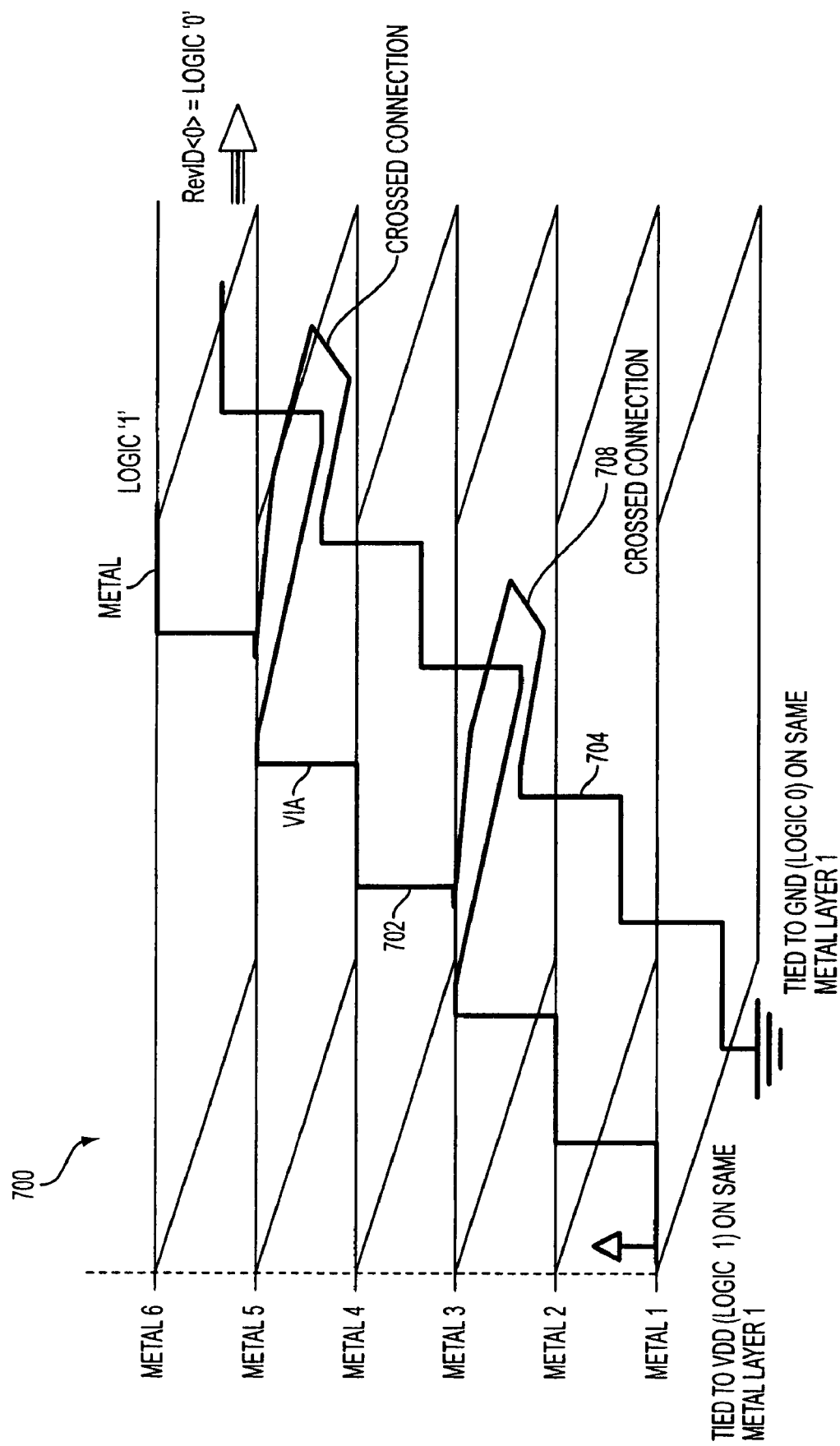
FIG. 7D illustrates a further revision of the MMCEL 700 according to the present invention.

Turning to FIG. 7D, a further revision of the MMCEL 700 can be performed at another metal layer, such as M3. Again, the metal traces of ladder 702 and 704 are cross-connected at M3, as shown generally at a region 708. This second revision of the output of MMCEL 700 returns the output of ladder 702 to a logic 1 state and the output of ladder 704 to a logic 0 state. Of course, if subsequent revisions of the integrated circuit are performed on the same metal layer the two cuts and jumps as described in connection with cross connection 706, for example, could simply be reversed in order to change the output of the MMCEL.

Figure 8A:
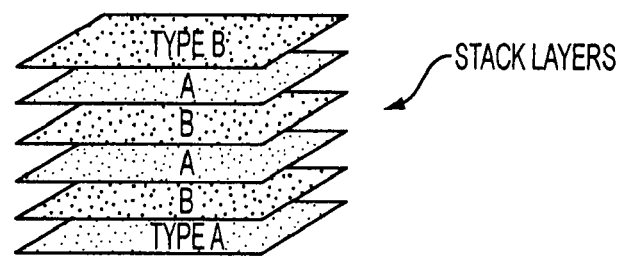
FIG. 8A shows vertically stacked MMCEL layout patterns according to the present invention.
Figure 8B:
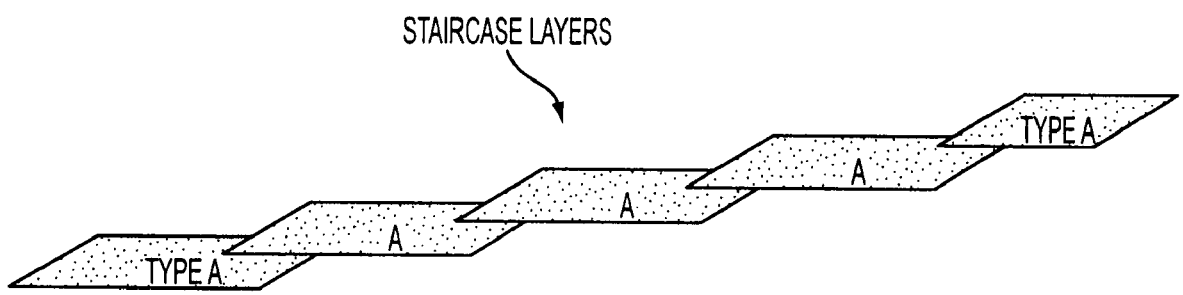
FIG. 8B shows staircase MMCEL layout patterns according to the present invention.

The dual output MMCEL of the present invention can be implemented using stacked layers of the same layout pattern. Two such stacking approaches are shown in FIGS. 8A and 8B. FIG. 8A shows a vertically stacked layer approach. The stacked structure of FIG. 8A comprises alternating layers labeled type A and type B. Type A is hereafter referred to as a normal pattern and type B as a flipped pattern. The flipped pattern B is a mirror image of the normal pattern A, as will be described below.

FIG. 8B shows a staircase of layers all having the same type A layout pattern. The staircase layer approach requires more chip real estate to implement than the stacked layer approach of FIG. 8A. Both of the stacked and staircase layer approaches are achieved by aligning the output vias of the bottom layer to the input vias of the top layer, as described below.

Figure 9A:
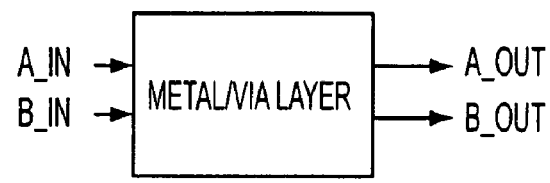
FIGS. 9A, 9B, 9C and 9D illustrate the basic MMCEL switching of the dual output MMCEL according to the present invention.
Figure 9B:
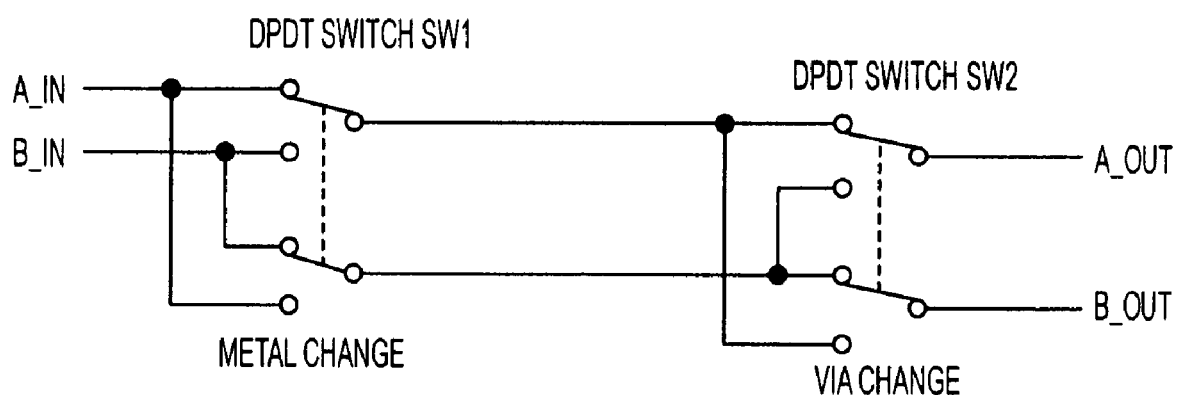

First, however, the basic switching of the dual output MMCEL will be described in connection with schematic diagrams of FIGS. 9A and 9B. An exemplary metal or via layer having two inputs (labeled A_in and B_in) and two outputs (labeled A_out and B_out). The schematic diagram of FIG. 9B shows electrically equivalent double pull double throw (DPDT) switches for each metal change or via change. DPDT switch SW1 represents a metal change and DPDT switch SW2 represents a via change. The logic convention assigned to the switches is that a switch in the 'up' position equates to a logic '0' and in the 'down' position equates to a logic '1'. The following logic table (Table 1) demonstrates how the output can be modified according to the state of switches SW2 and SW1:

TABLE 1

| SW2 | SW1 | A_out | B_out |
|---|---|---|---|
| 0 | 0 | a_in | b_in |
| 0 | 1 | b_in | a_in |
| 1 | 0 | b_in | a_in |
| 1 | 1 | a_in | b_in |

Figure 9D:
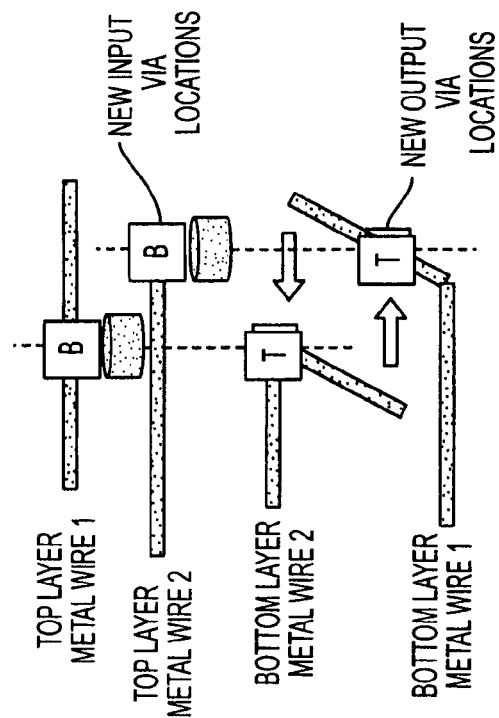
Figure 9C:
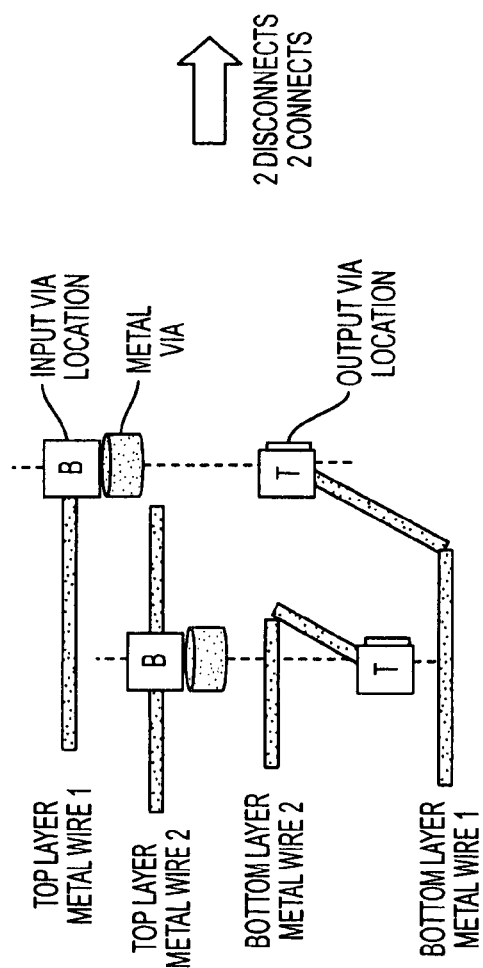

FIGS. 9C and 9D illustrate metal vias inserted between the "b" and "t" via locations to connect the bottom layer metal wires to the top layer metal wires. Via location "b" means bottom input and via location "t" means top output. FIG. 9C shows a connection between the bottom layer metal wire 1 and the top layer metal wire 1. Also, there is a connection between the bottom layer metal wire 2 and the top layer metal wire 2. FIG. 9D shows the result of two metal via disconnection and two metal via connection starting from FIG. 9C. As a result, FIG. 9D shows a connection between the bottom layer metal wire 1 and the top layer metal wire 2. Also, there is a connection between the bottom layer metal wire 2 and the top layer metal wire 1. Hence, the configuration of FIG. 9D effectively emulates the effect of a double-pull double-throw switch that cross connects the metal wires between the bottom and top metal layers, as described above in connection with FIG. 9B.

Figure 10A:
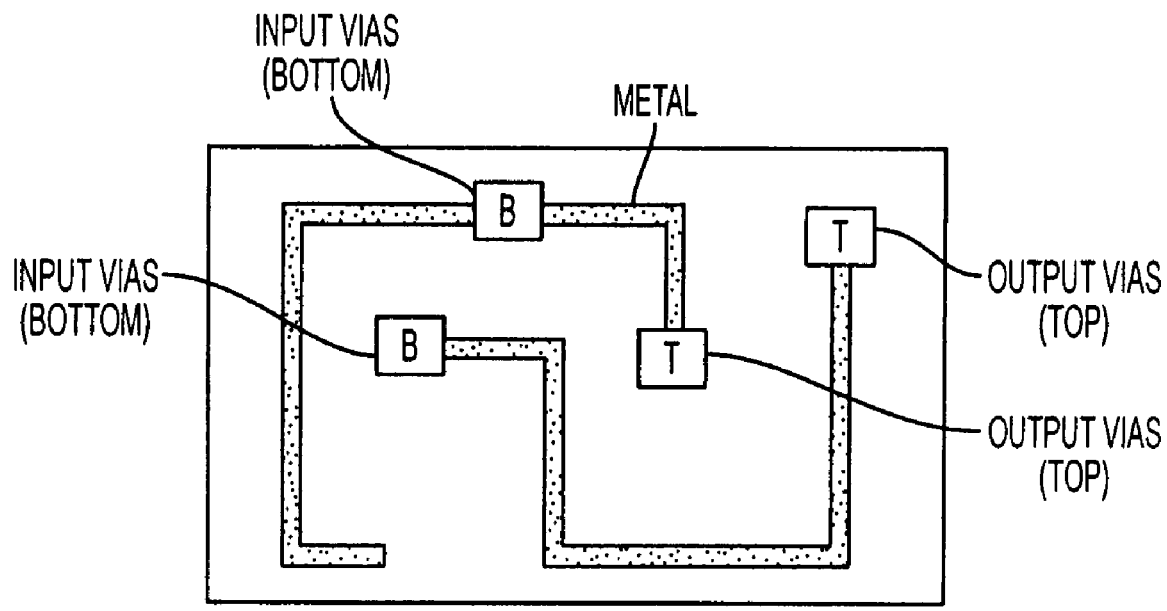
FIGS. 10A and 10B illustrate a basic MMCEL metal and via layer pattern template according the present invention.
Figure 10B:
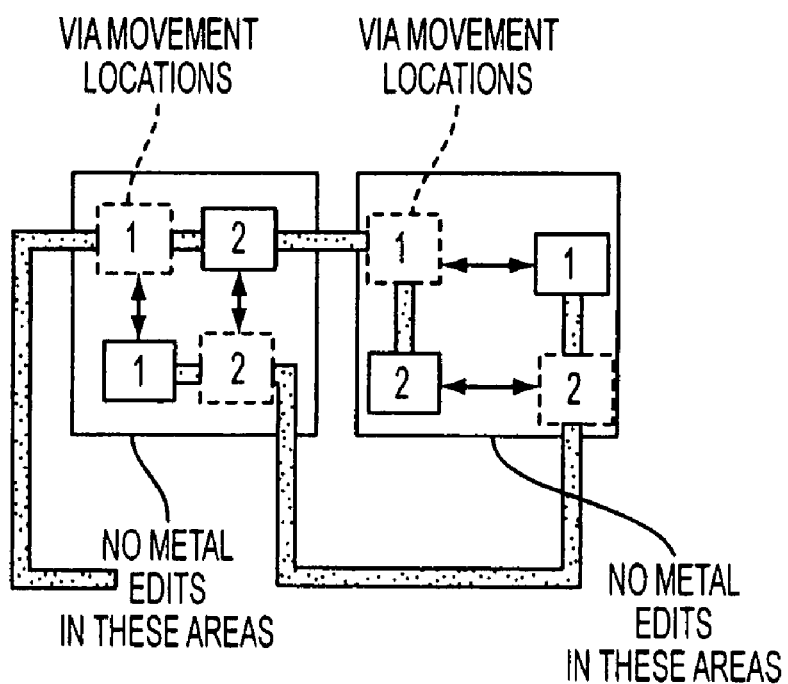

FIGS. 10A and 10B illustrate a basic metal and via layer pattern template according to the present invention. Input vias that connect to a bottom metal layer are labeled "b", while output vias that connect to the top metal layer are labeled "t". Metal traces of the pattern template are shown as solid black lines. The position of bottom vias on a current layer is determined by the position of corresponding top vias on an adjacent bottom metal layer. Therefore, for single via layer changes, only output vias on the current layer are allowed to be moved and input vias remain fixed. This is illustrated in FIG. 10B.

Space is allocated to make the metal edits (cuts and jumps) and also to remove and place the vias. Layout rules are used, such as "keep-out" sections where the metal edits can be implemented along with specific via placement locations. These layout rules ensure the functional integrity of the MMCEL for future modifications. Two keep-out sections surrounding the input vias and output vias are shown in FIG. 10B.

The two bottom (input) vias on the left keep-out area of FIG. 10B are labeled 1 and 2, respectively. Similarly, the two top (output) vias are also labeled 1 and 2, respectively, on the right keep-out area of FIG. 10B. The darker shaded numbers 1 and 2 on both the left and right portion of FIG. 10B correspond to the initial locations of the input and output vias of FIG. 10A. A via change comprises relocating the via layer pattern from the initial positions to new positions illustrated by the dashed boxes and arrows at FIG. 10B. MMCEL layout edit rules for via changes will be described in more detail below.

In an embodiment of the present invention, the logic state of the MMCEL outputs can be inverted simultaneously by following the MMCEL's own layout design edit rules in altering a metal or via layer. There are basically four metal layer edit rules and four metal via edit rules. These rules ensure that current layout changes inside the MMCEL preserve the functionality and integrity of the MMCEL. Also, the edit rules are designed to allow future changes to the metal structure of the same MMCEL, since revision ID bits or default register values often change more than once. Hence, the MMCEL has the unlimited capability to be modified by a user in order to invert its output values at any single metal or via layer.

Figure 11C:
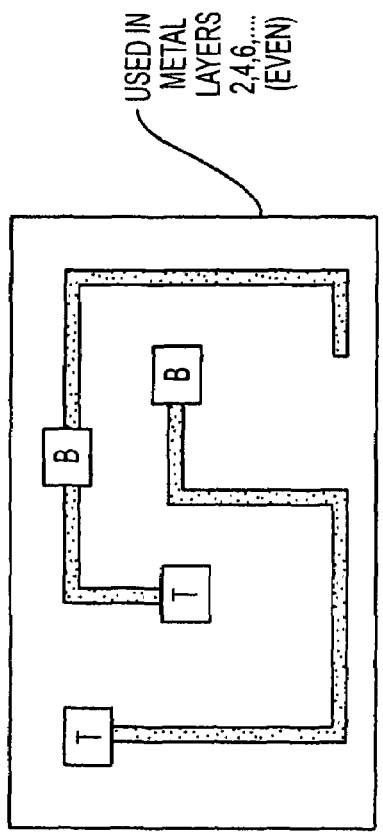
Figure 11D:
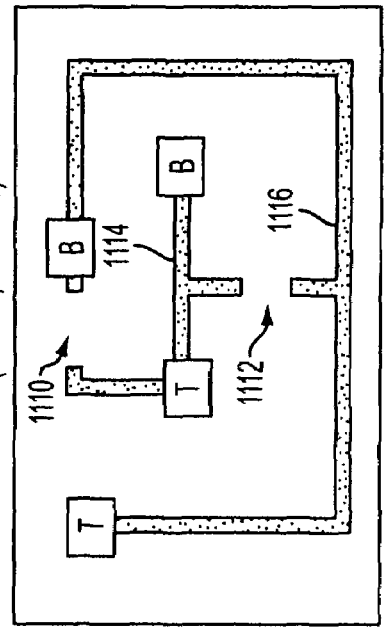
Figure 11A:
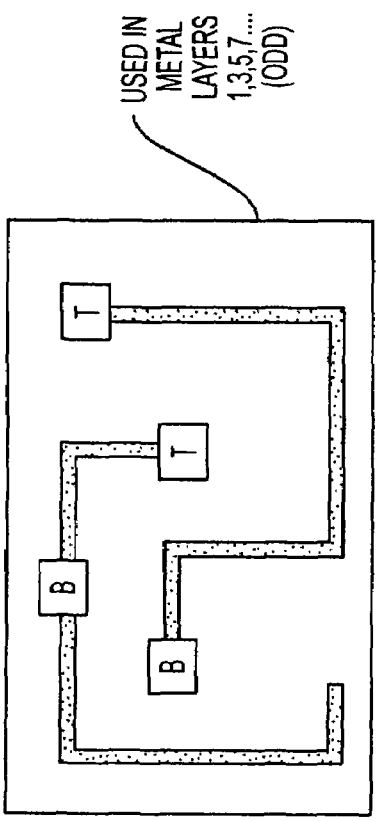

FIGS. 11A-D illustrate MMCEL layout edit rules for metal changes. A basic metal and via layer pattern template is illustrated in FIG. 11A and a flip basic pattern is illustrated in FIG. 11C. The basic pattern of FIG. 11A is used in the odd metal layers (e.g., M1, M3, M5, etc.). The flip basic pattern is used in even metal layers (e.g., M2, M4, M6, etc.). Reversal of these patterns (i.e., basic on even metal layers and flip on odd) is also contemplated.

Figure 11B:
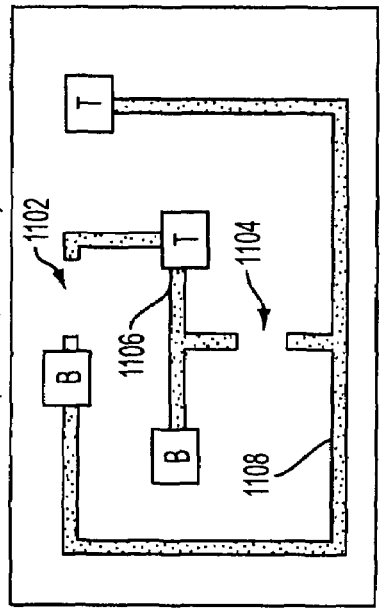

The MMCEL metal edit rule comprises two cuts and two jumps in order to implement a metal change for either the basic pattern or the flip basic pattern. FIG. 11B shows two cuts 1102 and 1104 and two jumps 1106 and 1108 used to implement a basic pattern metal change. Similarly, FIG. 11D shows two cuts 1110 and 1112, as well as two jumps 1114, 1116, which implement the flip basic pattern metal change.

MMCEL via edit rules will now be described in connection with FIGS. 12A-12D. FIGS. 12A and 12B illustrate the basic metal and via layer pattern template. FIGS. 12C and 12D show the flip basic pattern. In order to implement a via edit on the basic pattern, two disconnects and connects of vias are required. A first via (labeled "1") is disconnected from trace 1202 and a connection is made to trace 1204. Additionally, a second via (labeled "2") is disconnected from metal trace 1204 and then connected to trace 1202, as shown in FIG. 12B. The order in which the disconnects and connects are performed is irrelevant. Similarly, a via edit for the flip basic pattern is shown in FIG. 12D. Via 1 is disconnected from trace 1204 and then connected to trace 1206, while via 2 is disconnected from trace 1206 and then connected to trace 1204.

FIG. 13 illustrates MMCEL basic pattern layout permutations. Four patterns are shown, including pattern A, pattern B, pattern C and pattern D.

Beginning with pattern A, a via change according to the above described rules results in what is shown in pattern B. Alternatively, starting at pattern A, a metal change according to the above-described rules results in what is shown at pattern D. Thus, the via disconnects and connects and metal cuts and jumps are illustrated for each metal or via permutation starting with any one of the four patterns. Similarly, FIG. 14 illustrates an MMCEL flip basic pattern layout permutation. Four patterns are shown including pattern E, pattern F, pattern G and pattern H. Again, all via disconnects and connects and metal cuts and jumps required to move from one pattern to another pattern are shown in FIG. 14 for the flip basic pattern.

The vias labeled 1 and 2 in FIGS. 13 and 14 represent the top vias described above in connection with basic patterns. Thus, the vias labeled "b" in FIGS. 13 and 14 are provided at these locations by way of example and not limitation. In other words, in an actual implementation the positioning of the b vias will depend upon the positioning of the vias coupled to a lower metal layer. Therefore, the b vias shown on FIGS. 15A-15D do not correspond specifically to the b vias of FIGS. 13 and 14, because their position is dependent upon the location of each underlying metal layer via, as addressed above in connection with FIGS. 10A & 10B. FIGS. 15A-15D illustrate a triple metal stack layout example according to the present invention. Basic pattern layouts are shown at the bottom and top of each one of FIGS. 15A-15D that are associated with M1 and M3, respectively. A flip basic pattern is shown in the middle of the stack in each of FIGS. 15A-15D, and corresponds to M2. Each basic or flip pattern layout of FIGS. 15A-15D are also labeled as pattern A through pattern H as described above in connection with FIGS. 13 and 14.

An initial structure of the stack layout example is shown in FIG. 15A. The basic layout pattern at M1 in FIG. 15A shows a first metal trace tied to ground having a first via labeled "1", and a second metal trace tied to power and coupled to a second via labeled "2". The flip basic pattern E of FIG. 15A has a first metal trace with vias labeled "b" and "2". Via b electrically couples the first metal trace at M2 to the first metal trace of M1 at the same via, as illustrated by vertical lines 1502. Thus, the first metal trace of the flip basic pattern E at M2 is also coupled to ground.

A second metal trace of flip pattern E at M2 is coupled to two vias labeled "1" and "b". As described above, the vias labeled "b" indicate that via is coupled electrically to a bottom metal layer. Thus, the second trace of flip pattern E is electrically coupled to the second metal trace of basic pattern A at M1, and is thus coupled to power.

The right most vias at M2 couple the first and second traces of flip basic pattern E to the metal traces at M1. The two left most vias of flip basic pattern E at M2 couple the M2 traces to the M3 traces stacked thereon. In this arrangement, the via labeled "2" couples the first trace of a flip basic pattern E at M2 to a first metal trace of basic pattern A at M3. This coupling is shown at 1504. The output RevID<0> of this MMCEL is a logic 0 as provided at a top via labeled "1" on the first metal trace of basic pattern A at M3. Although not shown on this figure, a logic 1 is available at the second top via labeled "2" on the second metal trace of basic pattern A at M3.

FIG. 15B illustrates a metal change at the center layer of the stack layout shown in FIG. 15A. The metal change at center layer represents basic pattern H shown in FIG. 14. Based on this change, which includes two cuts and two jumps, the right most via b at the center layer is now electrically coupled via a metal trace to the second top via at the center layer, which in turn is coupled to the first trace at M3. This metal layer change at the center layer causes the RevID<0> to change from a logic 0 to a logic 1. While the signal coupling to the top via labeled "1" at M3 is provided to M2 as in 1504 in FIG. 15A, the operative coupling between M2 and M1 is now provided by the other bottom via of M2 as shown at 1506.

FIG. 15C illustrates a via change at the center layer. Because a via change is at the center layer, the flip basic pattern now corresponds to pattern G of FIG. 14. Thus, via 1 of pattern A at M1 provides a ground signal to M2, which in turn provides ground to M3 at via 2 of flip pattern G. These connections are shown at 1508 and 1510, respectively. Accordingly, the output at M3 via 1 is changed from a logic 1 to a logic 0.

A final revision example is shown in FIG. 15D, which comprises a metal change at the center layer. In this case, via 2 of M1 is used to couple power to M2. Using the flip pattern F, the second via of M2 is used to couple power to M1, as shown at 1512 and 1514, respectively. In this manner via 1 of M3 is switched from logic level 0 to logic level 1.

FIGS. 16, 17A-C, 18A-C, 19A-C, 20A-C and 21A-C illustrate an MMCEL layout in a six metal layer implementation according to the present invention.

This exemplary MMCEL layout is implemented in layer M6 0.13 μm semiconductor manufacturing technology. Other known and future technologies employing metal (e.g., 0.18 µm aluminum, 0.13 µm copper, etc.), doped polysilicon, and the like, can be used as would be apparent to a person having ordinary skill in the art.

Figure 16:
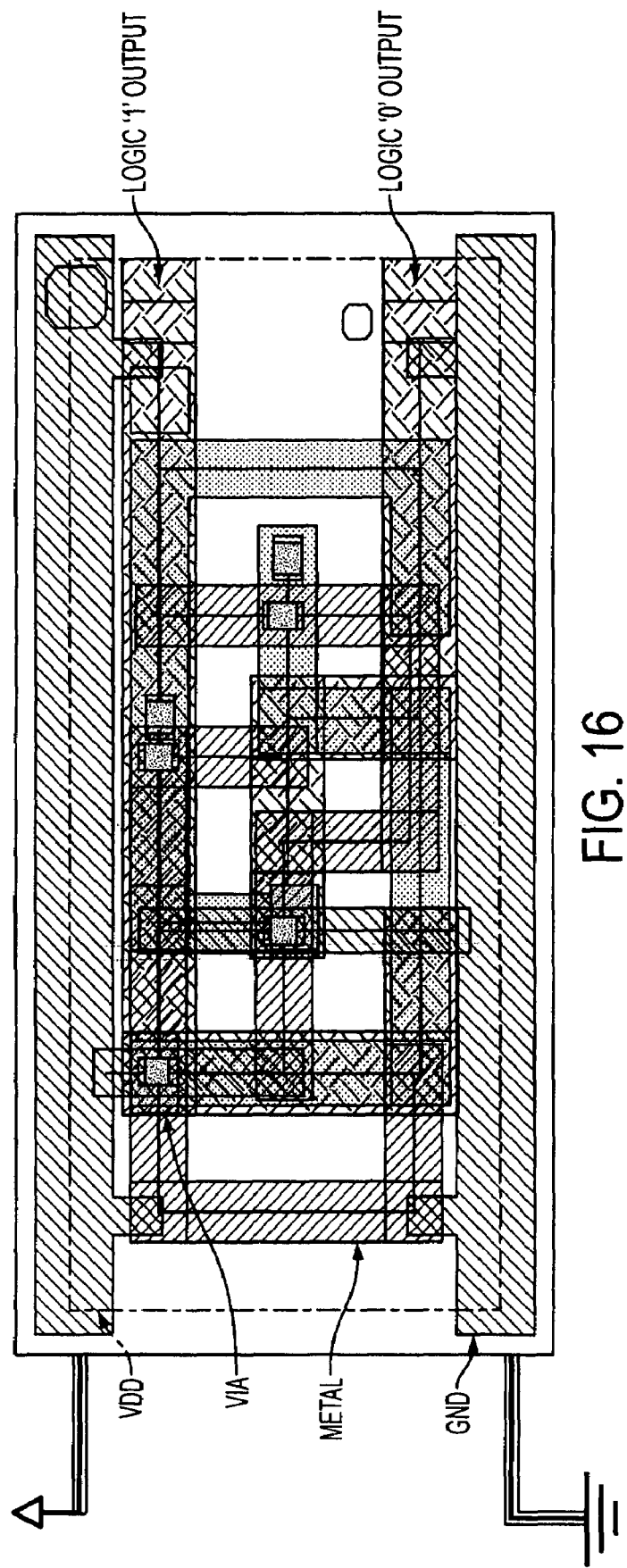
Figure 17B:
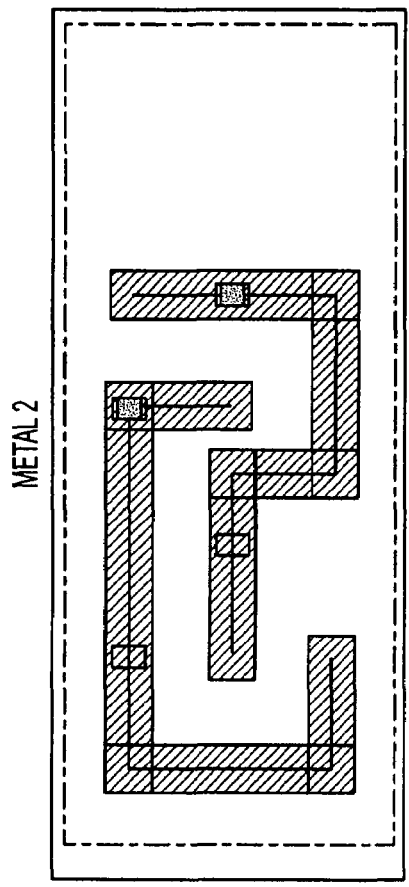
Figure 17A:
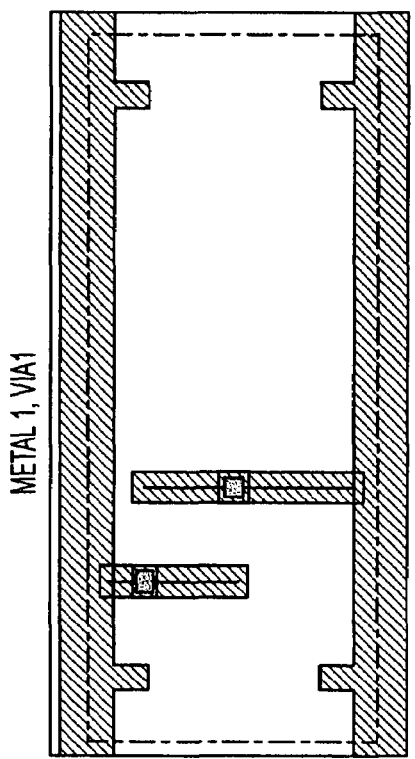
Figure 17C:
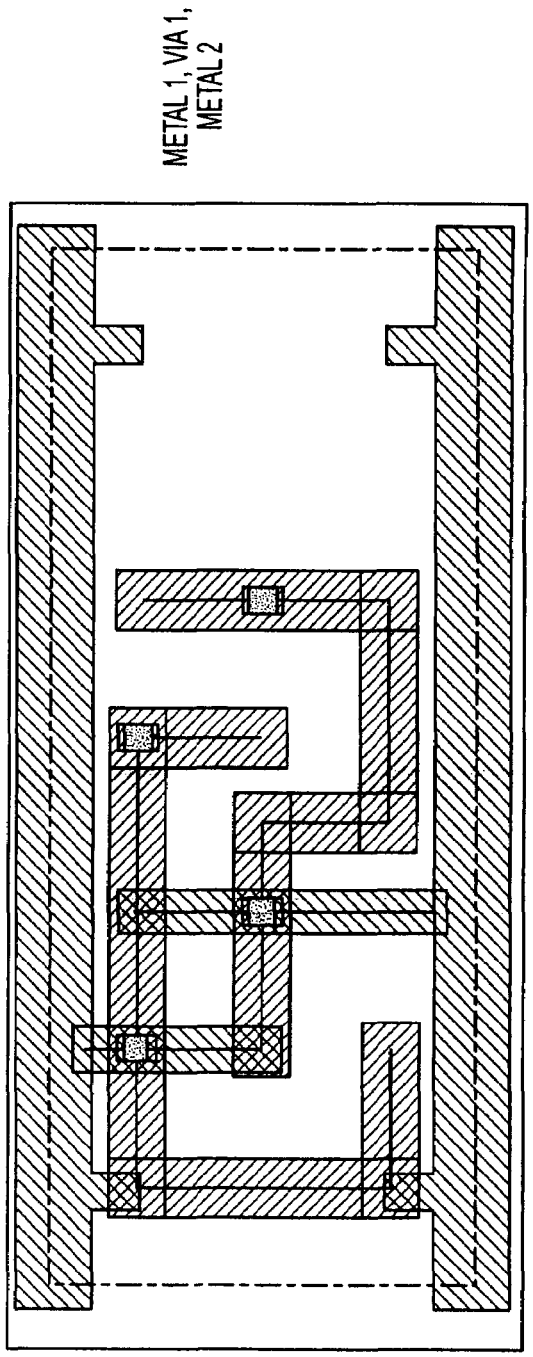
Figure 18B:
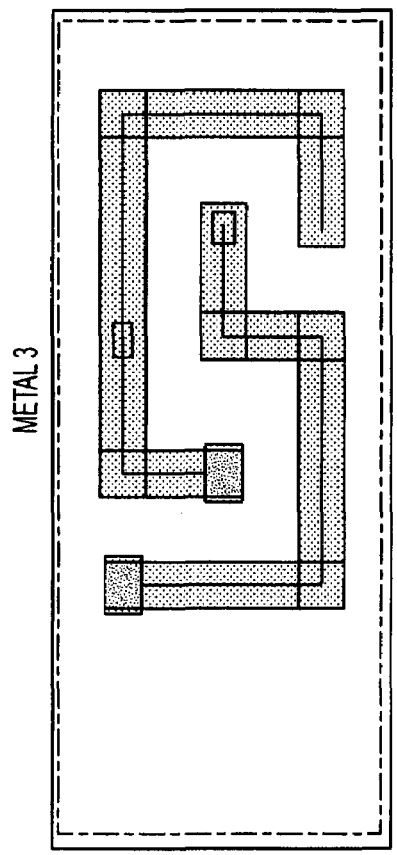
Figure 18A:
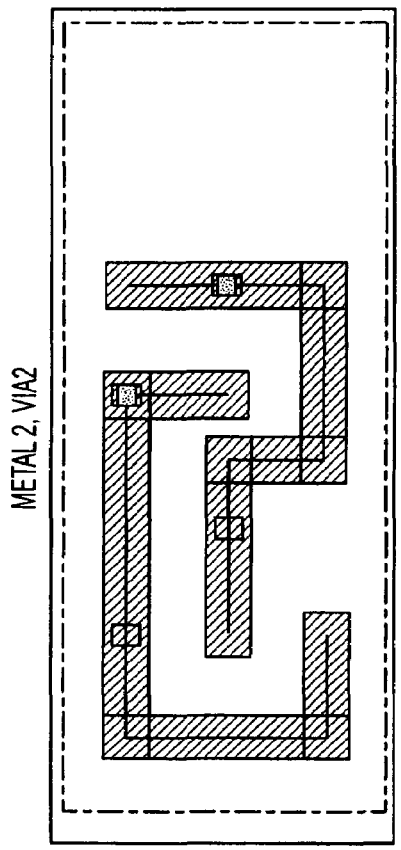
Figure 18C:
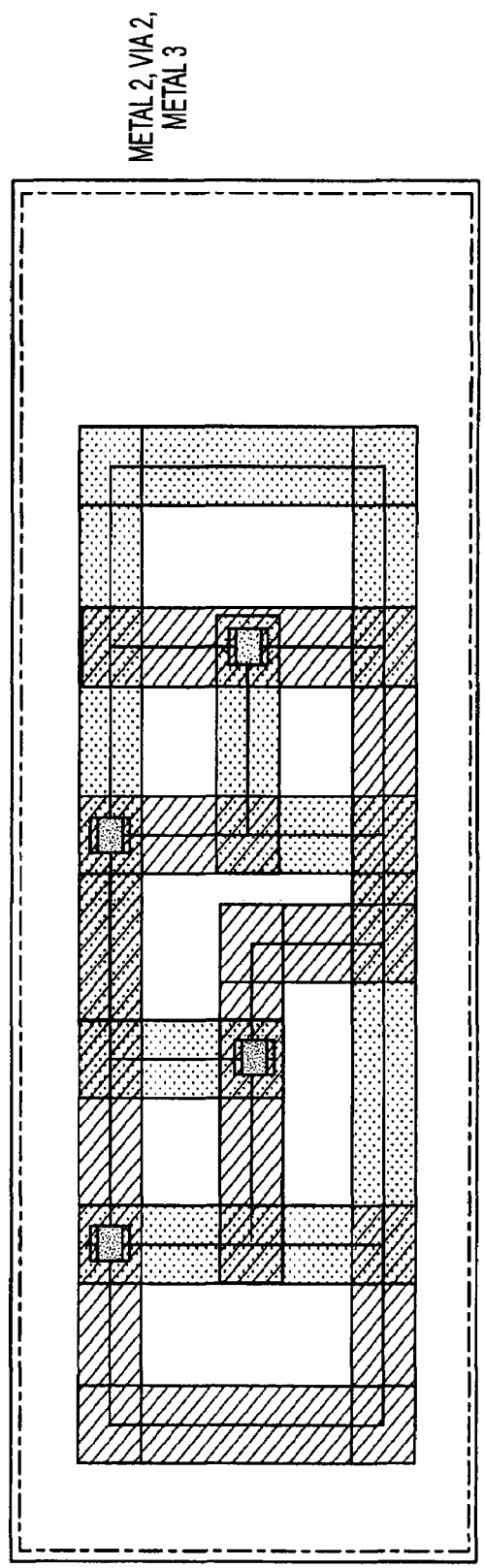
Figure 19B:
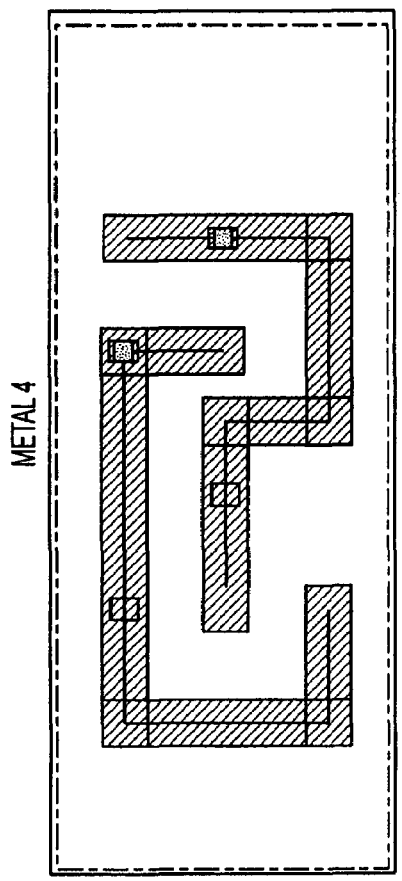
Figure 19A:
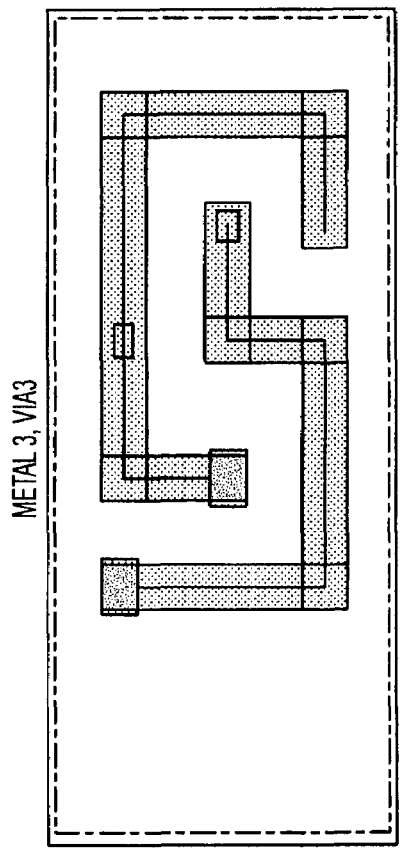
Figure 19C:
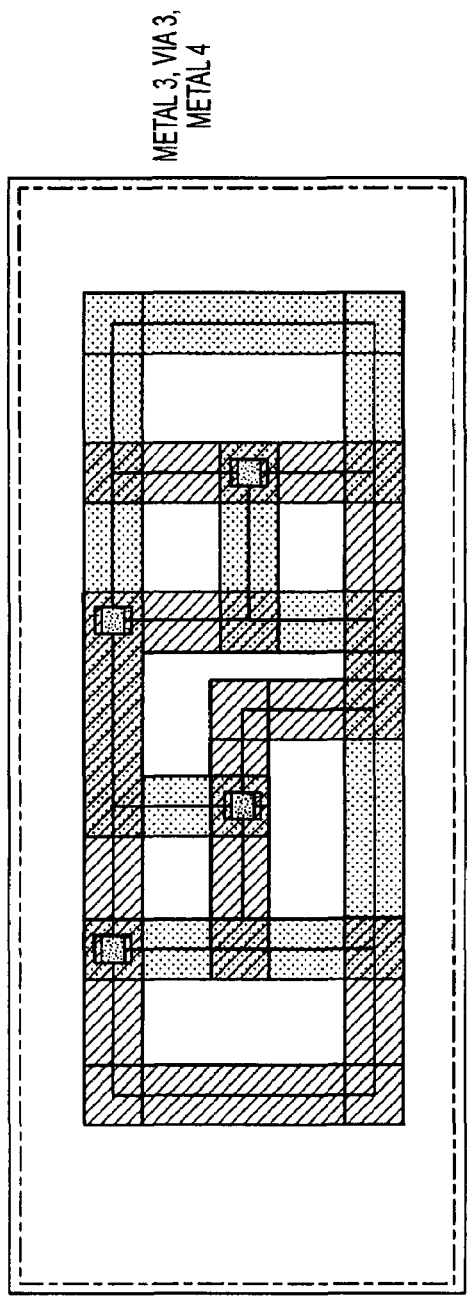
Figure 20A:
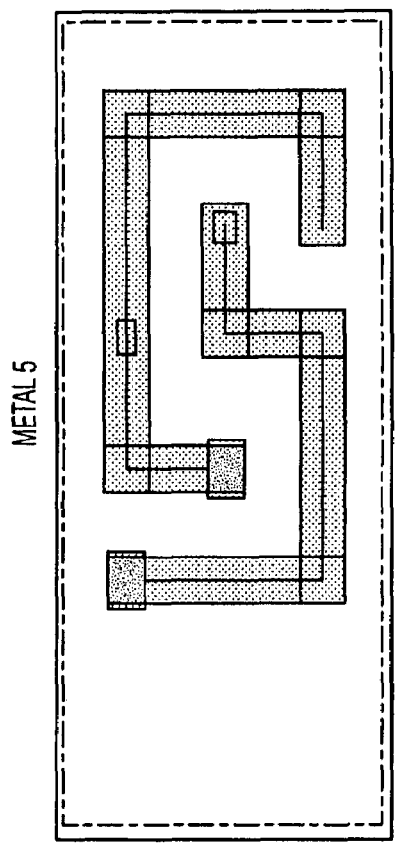
Figure 20B:
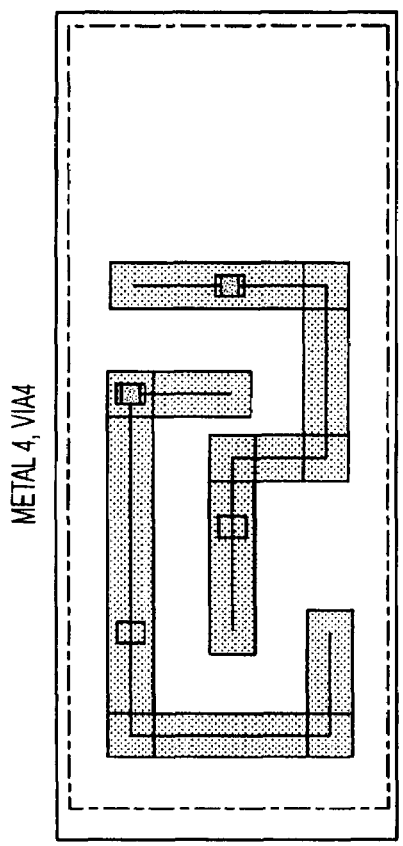
Figure 20C:
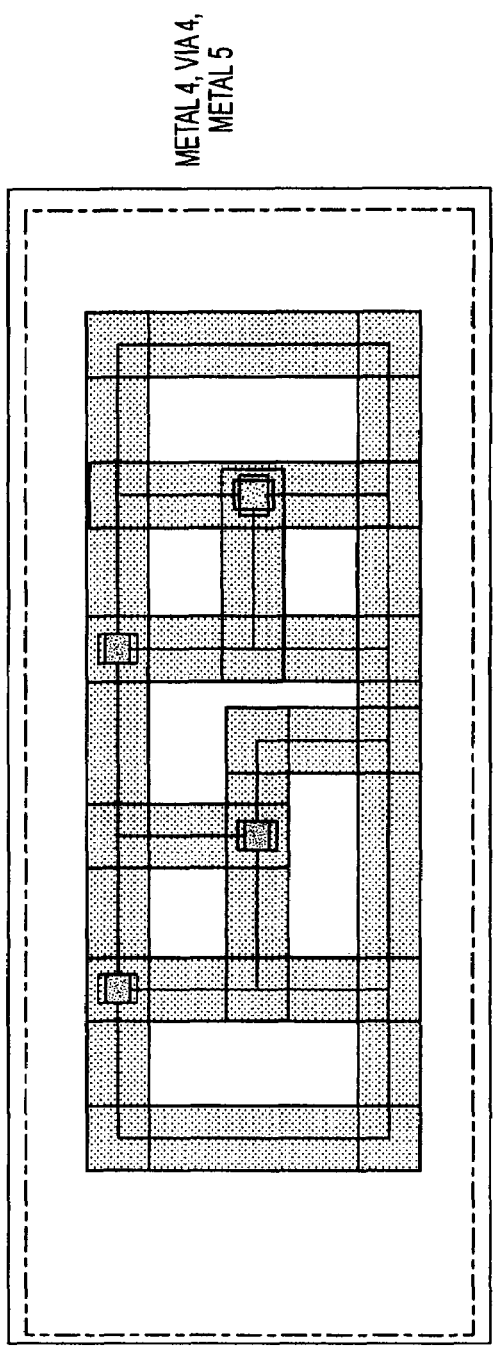
Figure 21A:
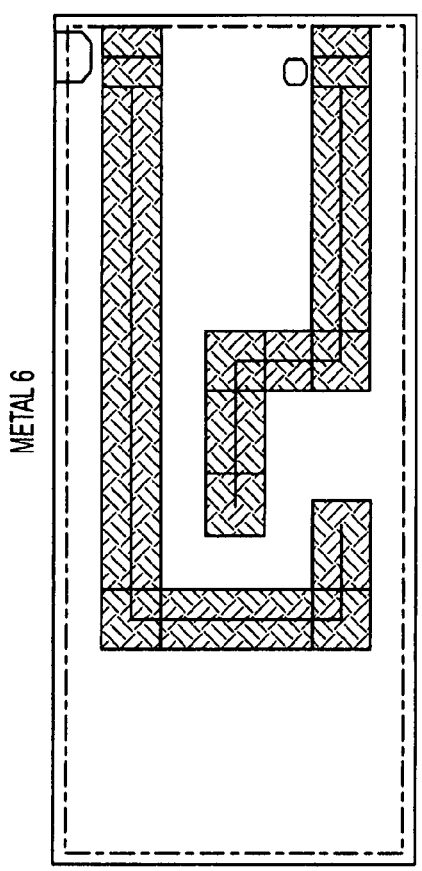
Figure 21B:
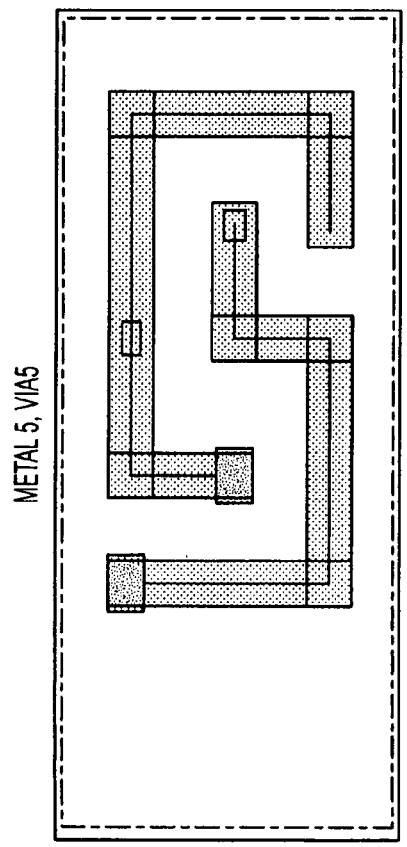
Figure 21C:
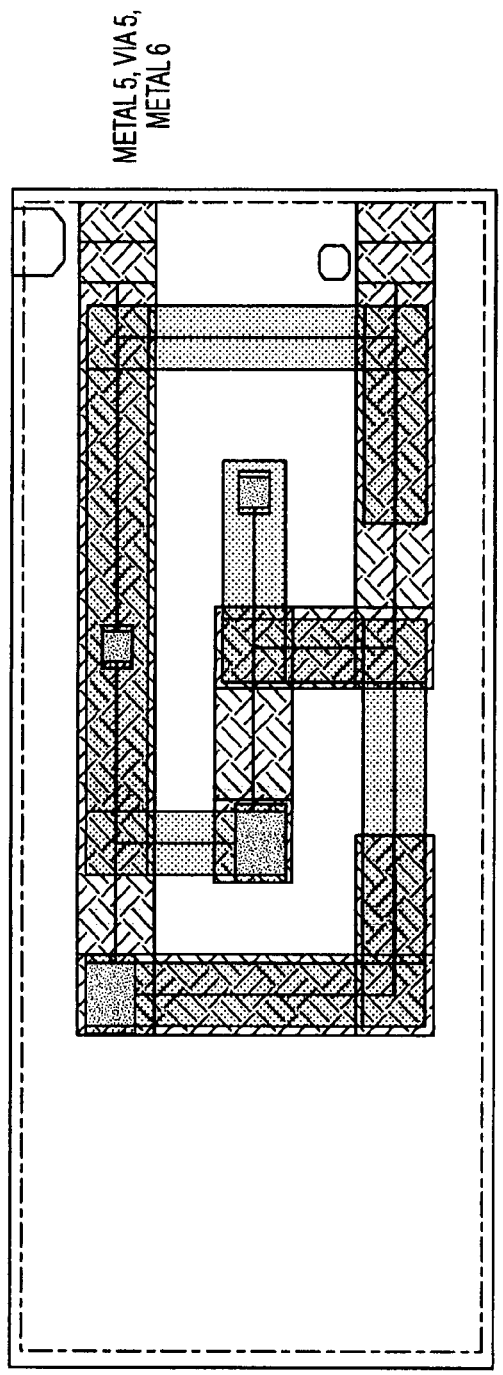

FIG. 16 shows all layers of the stacked structure. FIG. 17A shows M1 and via layer 1. FIG. 17B shows M2. FIG. 17C shows an overlay of M1, via 1 and M2 layers. FIGS. 18-21 show the remaining metal and via layers of the stacked structure. The dimensions shown in the figure are presented for illustration, and are intended to being limiting.

Layout blocks implemented with conventional "standard cells" have rows of same-height cells that abut as much as possible. Any gaps between the cells are typically filled with "filler" cells. These filler cells contain geometries to extend certain layers across the gaps, such as power straps and well implant. The gaps between the "standard cells" are caused by the inefficiency of the routing tool used by the layout designer. In order to comply with Design Rule Check (DRC) requirements, these gaps must be filled with the same basic material used in the "standard cells" in order to preserve the power supply and base layer connections. The chip will not function correctly if the filler cells are not inserted between the gaps.

One implementation of the MMCEL is a design that starts with a filler cell that has the same layout structure and size as a "Filler_16" cell so that all base layers will match. The only modifications the inventors needed to make were changes to the metal and via layers. For existing designs, the MMCEL becomes drop-in compatible for all metal layer changes. This enables the designers to instantiate a new MMCEL even after the base layers have been fabricated. The main advantages of using "Filler_16" are availability of existing "standard cells", drop-in capability, and no electrical impact to existing design.

Using the "standard cell" approach, an MMCEL layout in accordance with an embodiment of the present invention can meet the requirements for focused ion beam (FIB) anisotropic etching to implement edits. Ample space may be provided between the MMCEL's metal interconnect on the top metal layer so that a cut and a jump can be successfully implemented without creating a short. The FIB area can be located at the highest metal layer where it is readily accessible.

FIG. 22 illustrates the use of FIB technology for programming the MMCEL of the present invention. A FIB free space region is shown generally at 2202. Two parallel metal strips (traces) are shown generally at 2204. A cut of a metal trace is illustrated generally at 2206. A jump between two metal traces is shown at 2208. Metal "cuts" require more free space than metal deposition. Distance between parallel metal strips is dictated by design rules.

An MMCEL design in accordance with an embodiment of the present invention can also be used not only for revision ID applications, but also for programming the default values of internal registers. These internal registers basically define the operating modes of the chip and altering its default values causes the chip to behave in another desired functionality. If planned well enough in advance, the MMCEL can be used to meet specific requirements from different customers and provide a variety of applications for a single chip design.

Conventional methodologies for providing a programmable revision ID bit includes both silicon-based and metal only based designs. The silicon-based designs are implemented as programmable Non-Volatile Memory (PROM) where the default values are stored in a memory cell. The PROM is read at start-up and the contents used to initialize the revision ID bits or default registers. The advantages of this approach are ease of use and flexibility in implementation. However, there are also several drawbacks when compared to an MMCEL in accordance with an embodiment of the present invention. For example, the PROM requires an all-layer change, whereas the MMCEL only requires edits to one metal or via layer. The PROM requires additional support circuitry such as registers and programming logic, whereas the MMCEL requires none. The PROM-based method is less reliable than the MMCEL because the memory can lose retention unlike the MMCEL, which is hardwired and permanent (at least until a subsequent edit changes the value of the output of the MMCEL). Once implemented, the advantages of the MMCEL over the PROM-based design are that the MMCEL is cheaper, smaller in area, and provides better reliability.

CONCLUSION

Consequently, embodiments of the present invention provide at least the following advantages as compared to conventional methodologies: reduces additional metal mask costs due to revision ID and default register changes; reduces additional labor costs due to implementation of revision ID and default register changes; the metal layer only implementation reduces the costs and complexity of implementation; single metal layer or via layer changes can be made at any metal layer; provides unlimited modification capability; a small footprint size saves area on the chip; excellent reliability due to metal only implementation; dual output per cell, logic 1 and logic 0, eliminates need for inverters and buffers; fits in standard cell format which simplifies layout; can be physically FIB etched to change defaults after chip has been manufactured; can be placed anywhere on the chip to reduce routing congestion; can be implemented in existing or new chip designs; does not introduce Design Rule Check (DRC) and Layout vs. Schematic Check (LVS) errors in layout such as floating metal after changing a metal or a via layer; requires power and ground only on M1, which improves route ability and reduces blockage; and can be used to customize unique customer specific requirements by re-programming default registers. While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

We claim:

1. In an integrated circuit chip including a plurality of metal layers and first and second supply potentials, a programmable memory cell for storing a value, the memory cell comprising:

a plurality of first metal interconnect structures that traverse the plurality of metal layers using a first plurality of vias;

a plurality of second metal interconnect structure that traverse the plurality of metal layers using a second plurality of vias and coupled to the first metal interconnect structures to form a plurality of programmable cycles, wherein each half cycle is programmable at least once; and an output coupled to one of the first and second supply potentials by at least one of said first and second metal interconnect structures;

wherein at least one cycle is laid out to form a spiral-shaped structure that traverses the plurality of metal layers from a bottom metal layer to a top metal layer and back to the bottom metal layer, and wherein the first and second supply potentials comprise two buses located in a central region of the spiral-shaped structure and are accessible at each of the metal layers.

2. The memory cell of claim 1, wherein said spiral-shaped structure is arranged to form a cube-shaped structure.

3. In an integrated circuit chip including a plurality of metal layers and first and second supply potentials, a programmable memory cell for storing a plurality of values, the memory cell comprising:

a first metal interconnect structure that traverses the plurality of metal layers using a first plurality of vias;

a second metal interconnect structure that traverses the plurality of metal layers using a second plurality of vias; and outputs coupled to the first and second supply potentials by said first and second metal interconnect structures;

wherein said first and second metal interconnect structures are arranged to form a stacked structure comprising first and second alternating metal interconnect patterns, and wherein said first alternating metal interconnect pattern comprises first and second interspersed metal traces, said second alternating metal interconnect pattern comprises third and fourth interspersed metal traces, and said third and fourth interspersed metal traces form a mirror image of first and second interspersed metal traces.

4. The memory cell of claim 3, wherein said first plurality of vias interconnect ones of said first and third interspersed metal traces and said second plurality of vias interconnect ones of said second and fourth interspersed metal traces.

5. The memory cell of claim 3, wherein one of said first and second metal interconnect structures is coupled to the first supply potential at a bottom metal layer and the other of said first and second metal interconnect structures is coupled to the second supply potential at the bottom metal layer.

6. The memory cell of claim 3, wherein said first and second metal interconnect structures are arranged to form a ladder structure.

7. The memory cell of claim 3, wherein said first and second metal interconnect structures are arranged to form an offset ladder structure.

* * * * *